(12) United States Patent
Arknaes-Pedersen

(10) Patent No.: US 7,852,150 B1
(45) Date of Patent: Dec. 14, 2010

(54) SWITCHING AMPLIFIER DRIVEN BY A CONTROLLED POWER SUPPLY

(75) Inventor: Lars Arknaes-Pedersen, Viby J (DK)

(73) Assignee: The TC Group A/S (DK)

( * ) Notice: Subject to any disclaimer, the term of this patent is extended or adjusted under 35 U.S.C. 154(b) by 64 days.

(21) Appl. No.: 12/341,005

(22) Filed: Dec. 22, 2008

Related U.S. Application Data

(60) Provisional application No. 61/015,459, filed on Dec. 20, 2007.

(51) Int. Cl.
*H03F 3/38* (2006.01)
(52) U.S. Cl. ............ 330/10; 330/207 A; 330/297
(58) Field of Classification Search ............ 330/10, 330/251, 207 A, 297, 279, 127
See application file for complete search history.

(56) References Cited

U.S. PATENT DOCUMENTS

| | | | | |
|---|---|---|---|---|
| 6,373,340 | B1 * | 4/2002 | Shashoua | 330/297 |
| 7,321,262 | B2 * | 1/2008 | Nielsen et al. | 330/10 |
| 7,518,444 | B2 * | 4/2009 | Andersen et al. | 330/10 |

* cited by examiner

*Primary Examiner*—Hieu P Nguyen
(74) *Attorney, Agent, or Firm*—Cantor Colburn LLP

(57) ABSTRACT

The invention relates to a switching amplifier comprising at least one pulse modulator arranged for modulating at least one input utility signal into at least one pulse modulated signal and at least one switching power stage arranged to establish at least one amplified utility signal on the basis of said at least one pulse modulated signal and a power signal, said power signal being delivered by a tracking power supply at least partly controlled by said at least one input utility signal, characterized in that said switching amplifier is arranged to process said at least one input utility signal according to a correction signal established by a correction signal estimator on the basis of a supply information signal derived from said tracking power supply.

Figure 1:
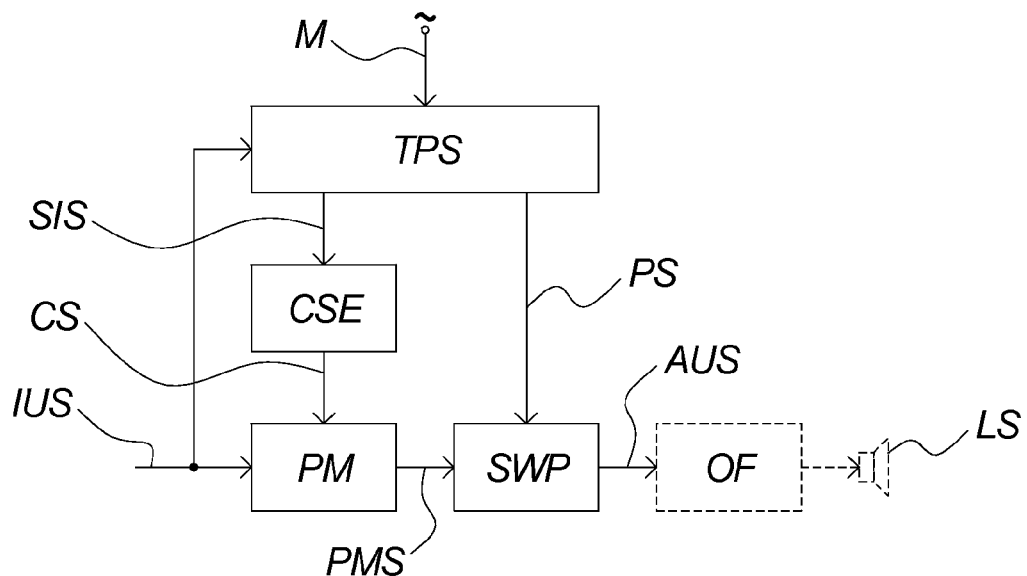

According to the present invention an advantageous switching amplifier enabling use of a tracking power supply is provided. Thereby the many benefits of switching amplifiers can now be obtained together with the benefits of utilizing a tracking power supply. Among many things, this reduces power consumption, reduces EMI noise and enables using more of the dynamic range available for the utility signal during the pulse modulation. The last advantage further renders noise introduced by the power supply and the switching output stage less significant, as the signal-to-noise ratio in the power stage is greatly improved due to the utilization of the full dynamic range enabled by using a tracking power supply.

30 Claims, 11 Drawing Sheets

SWITCHING AMPLIFIER DRIVEN BY A CONTROLLED POWER SUPPLY

CROSS-REFERENCE TO RELATED APPLICATION

This application is related to and claims the benefit of U.S. Provisional Patent Application Ser. No. 61/015,459 filed on 20 Dec. 2007. The contents of said provisional application are herein incorporated by reference in their entirety.

FIELD OF THE INVENTION

The present invention relates to switching amplifiers, in particular how to supply an open-loop switching amplifier from a tracking or variable power supply.

BACKGROUND OF THE INVENTION

Switching amplifiers, class-D amplifiers, PWM amplifiers, etc., are amplifiers that work by in principle multiplying the input utility signal, e.g. an audio signal, with a power signal, e.g. a DC voltage. They have many advantages and are becoming more and more popular in both consumer and professional markets as their quality increase.

Some of the disadvantages, however, that still exist with the known switching amplifiers are related to the way power is supplied to the amplifier. In order to be able to produce a full scale amplified audio signal, the switching power stage in previous switching amplifiers is continuously supplied with a maximum DC voltage, also when the utility signal is small or silent, or when the volume is decreased. The continuous high DC voltage even at idle times causes unnecessary much noise and EMI problems as the noise is proportional with the supply voltage, and the power consumption becomes unnecessarily high as most of the loss is proportional to the square of the supply voltage.

Some previous amplifiers solve some of the problems by letting the volume control, which normally scales the utility signal, act on the power supply voltage instead.

Another approach is to use a so-called tracking power supply, which varies the supply voltage in accordance with the utility signal by some predefined rule. The concept theoretically works because the product of a certain utility signal value and the DC supply voltage can also be achieved by multiplying a higher utility signal value with an accordingly lower supply voltage. Thus, by always decreasing the DC supply voltage to a value where a corresponding increase in utility signal value approaches the clip value, the highest possible utility signal value is always multiplied with the lowest possible supply voltage, and noise and power dissipation are reduced. Whereas it is relatively simple to establish a DC supply voltage that "tracks" the input utility signal, a sufficiently accurate corresponding correction of the utility input signal represents a problem.

For a certain kind of switching amplifiers, namely amplifiers with an error correcting feedback loop, a solution for implementing a tracking power supply is described in PCT Patent Application No. WO 2005/036731 A2. In this patent application is disclosed a power supply that delivers a DC supply voltage in some predefined correspondence with the input signal. Obviously, the varying supply voltage causes distortion of the amplifier output signal, in the same way as other power supply errors such as ripple, etc., but because of the error suppression enabled by the feedback loop, the input signal is automatically adjusted inversely.

However, none of the embodiments disclosed in the above-mentioned patent application works with amplifiers that do not comprise an error suppression feedback loop as described. For such amplifiers, the so-called open-loop switching amplifiers, there has so far not been any way to benefit from the advantages of utilizing tracking power supplies.

It is therefore an object of the present invention to enable the use of a tracking power supplies with open-loop switching amplifiers.

SUMMARY OF THE INVENTION

The present invention relates to a switching amplifier comprising
- at least one pulse modulator PM; PM1 . . . PMn arranged for modulating at least one utility signal IUS; IUS1 . . . IUSn; OUS into at least one pulse modulated signal PMS,
- at least one switching power stage SWP; SWP1 . . . SWPn arranged to establish at least one amplified utility signal AUS on the basis of said at least one pulse modulated signal PMS and a power signal PS; PPS, NPS, said power signal being delivered by a controlled power supply TPS; VPS, and
- a correction signal estimator CSE arranged to establish a correction signal CS, wherein said controlled power supply TPS; VPS, correction signal estimator CSE and at least one pulse modulator PM are arranged according to one of
- said controlled power supply TPS being controlled at least partly on the basis of said at least one utility signal IUS; IUS1 . . . IUSn, said correction signal CS being established on the basis of a supply information signal SIS derived from said controlled power supply TPS, and said pulse modulator PM processing said utility signal IUS; IUS1 . . . IUSn according to said correction signal CS, and
- said at least one utility signal OUS being established at least partly on the basis of at least one input utility signal IUS; IUS1 . . . IUSn according to a gain factor GF, said correction signal CS being established on the basis of said gain factor GF, and said controlled power supply VPS being controlled at least partly on the basis of said correction signal CS.

According to the present invention an advantageous switching amplifier enabling use of controlled power supplies, i.e. tracking or variable power supplies, is provided. Thereby the many benefits of switching amplifiers can now be obtained together with the benefits of utilizing a tracking power supply and/or the dynamics of the utility signal can be optimized with automatic, consequential adjustments of a variable power supply. Among many things, these initiatives reduce power consumption, reduce EMI noise and enables using more of the dynamic range available for the utility signal during the pulse modulation. The last advantage further renders noise introduced by the power supply and the switching output stage less significant, as the signal-to-noise ratio in the power stage is greatly improved due to the utilization of the full dynamic range enabled by using a tracking or variable power supply and corresponding correction means. Furthermore, as the noise, in particular in digital, open-loop PWM amplifiers, is proportional with the supply voltage, a decrease of supply voltage leads to a corresponding noise floor decrease, which is a very advantageous aspect of the present invention.

A switching amplifier may, according to the present invention, comprise any amplifier technology that in principle delivers an output that corresponds to the utility signal and the power supply signal in a multiplicative way. Any kind, encoding, origin and representation of the utility signal is within the scope of the present invention, e.g. analog or digital, encoded as PCM, MP3, etc., differential or single ended, electrical, optical or wireless, packet-based and/or real-time, single channel or multichannel etc., as long as the signal can be decomposed into one or more streams of consecutive values or continuous signals suitable for pulse modulation, e.g. pulse width modulation. In a preferred embodiment the input utility signal represents audio, and is meant for reproduction in loudspeakers subsequent to the amplification. The pulse modulators and pulse modulation may within the scope of the present invention comprise any suitable technology, but is preferably a kind of pulse width modulation. Any method of determining the switch times and generating the pulse modulated signal is within the scope of the present invention, e.g. analog comparator or hysteresis based modulation, self-oscillating modulation, digital processing and synthetic modulation, etc. Typically the switching power stage according to the invention comprises field-effect transistors, e.g. MOSFETs, e.g. arranged in a bridge configuration. In a preferred embodiment, the switching amplifier, in particular the pulse modulator and switching power stage is optimized for processing audio, i.e. arranged to altogether process an audio input signal as linearly as possible, except for any desired non-linear processing, e.g. limiting.

The switching amplifier may further within the scope of the present invention comprise additional components, e.g. processing of the utility signal before or after pulse modulation, e.g. in order to compensate for errors in the modulation stage and power stage, optimize the signal according to the loudspeakers if known, perform limiting, compression, coloration, etc., handle multi-channel issues such as cross-talk, handle switching power stage issues such as minimum pulse width capabilities, demodulating the pulse width modulated, amplified output signal, etc. The switching amplifier may further within the scope of the present invention be of an open-loop type without any feedback loop, or it may comprise a feedback loop e.g. around the switching power stage, possibly including a demodulator and/or the pulse modulator and/or any other processing elements, in order to suppress errors introduced by these components.

Any type of controlled, i.e. tracking or variable power supply is within the scope of the present invention as long as the power signal PS supports the kind of switching power stage SWP applied, e.g. single-ended or differential. A preferred tracking or variable power supply incorporates a switch mode power supply for controlling the delivered voltage, but any suitable technology is within the scope of the present invention. Any algorithm or method of at least partly tracking the input utility signal or controlling the power signal on the basis of the correction signal is within the scope of the present invention, and may be implemented by analog, digital or software means. It is noted that the term power signal in the present description is used to denote the actual power supply voltage and current delivered to the switching power stage. Even though the term signal often refers to information represented by a low-power electric signal, the term seem appropriate in the present context because the power signal, though typically high-powered, may comprise any suitable waveforms for voltage and current, and will actually vary at a relatively high rate, in particular with a fast and tight tracking algorithm.

The correction signal estimator may according to the present invention comprise any means for establishing a correction signal comprising information about how to change the input utility signal in order for compensating for the tracking and thereby varying power supply, or information about how to vary the power supply in order for compensating for the optimizations applied to the utility signal, respectively. The correction signal estimator at least partly works on the basis of information obtained from the tracking power supply signals transmitted to or from the tracking power supply, or it works on the basis of information obtained from the dynamics optimizer, respectively.

In a preferred embodiment the at least one utility signal comprises an input utility signal IUS. In an alternative embodiment the utility signal comprises a pre-processed input utility signal, e.g. an optimized utility signal OUS. In a preferred embodiment of the invention the controlled power supply comprises a tracking power supply TPS tracking the input utility signal IUS. In an alternative embodiment the controlled power supply comprises a variable power supply VPS being controlled by a correction signal CS.

When said correction signal CS comprises a correction factor, an advantageous embodiment of the present invention is obtained.

In a preferred embodiment of the invention, the correction signal is encoded as a correction factor which can easily be multiplied with the input utility signal, or used as a ratio to control a variable power supply. This embodiment is very advantageous, as the error is in nature a factor due to the switching amplifier's multiplicative working principle, and a correction factor is therefore relative easily determined and applied to the utility signal or power supply without considering the different signal scales, absolute values, dynamic ranges, etc.

When said switching amplifier is an open-loop amplifier, an advantageous embodiment of the present invention is obtained.

In particular for open-loop switching amplifiers the present invention is very advantageous, as efficient and quality preserving ways of driving such an amplifier by a tracking or variable power supply have been missing so far.

When said switching amplifier comprises at least one feedback loop at least comprising said at least one switching power stage SWP; SWP1 . . . SWPn, an advantageous embodiment of the present invention is obtained.

Also switching amplifiers with feedback can be implemented with tracking or variable power supplies according to the present invention to obtain the benefits thereof. In such case, the correction signal and/or dynamics optimizer should be applied within the feedback loop, as the varying supply voltage is also applied within the loop at the switching power stage, and the feedback loop will therefore not recognize and fight the reaction and action caused by the correction signal estimator and tracking power supply, respectively.

When said switching amplifier is a multichannel amplifier comprising at least two pulse modulators PM; PM1 . . . PMn and at least two switching power stages SWP; SWP1 . . . SWPn, an advantageous embodiment of the present invention is obtained.

A preferred, advantageous embodiment of the present invention applies to multichannel amplifiers with a shared supply. A multichannel amplifier implementing the present invention becomes very beneficial as this enables a single power supply to efficiently and economically drive switching power stages of several channels, by just implementing a single correction signal estimator, the correction signal of which can be used by all channels.

When said switching amplifier comprises at least one output filter OF; OF1 ... OFn, preferably arranged to demodulate said amplified utility signal AUS into a signal suitable for reproduction by at least one loudspeaker LS; LS1 ... LSn, an advantageous embodiment of the present invention is obtained.

In a preferred embodiment the output filter comprises a low-pass filter with a pass-band substantially corresponding to the audio band, e.g. 20 kHz. Any output filter is, however, within the scope of the present invention.

When said correction signal estimator CSE comprises a ratio circuit RC; RC1, RC2, an advantageous embodiment of the present invention is obtained.

According to preferred embodiments of the present invention, the correction signal comprises a factor, i.e. a value suitable for multiplication with the input utility signal or nominal power signal in order to correct the multiplicative error applied in the switching power stage by the tracking power supply. In order to determine a multiplicative error and a correcting factor, the correction signal estimator preferably comprises a ratio circuit, i.e. a circuit arranged for finding a ratio, e.g. a software, hardware or analog implemented divider or any other means for finding a value corresponding to a ratio.

When said correction signal estimator CSE comprises at least one prediction circuit PC, an advantageous embodiment of the present invention is obtained.

According to the present invention, the prediction circuit may be common to all channels and all ratio circuits by being operating on the correction signal. Alternatively, a prediction circuit may be applied subsequent to both or more ratio circuits in order to handle different delays, and/or be applied individually to all channels in order to handle different delays or signal-dependent delays for each channel separately.

When a switch frequency of pulse modulation in said controlled power supply TPS; VPS is selected to be different from a switch frequency of pulse modulation in said at least one pulse modulator PM; PM1 . . . PMn, an advantageous embodiment of the present invention is obtained.

According to an embodiment of the present invention the switch frequency of the switch mode power supply and the switching amplifier(s), respectively, are different in order to avoid errors within the audio band due to any switch frequency ripple being multiplied with the pulse modulated utility signal in the switching power stages.

When the switching amplifier comprises at least one pulse modulator PM; PM1 ... PMn arranged for modulating at least one input utility signal IUS; IUS1 ... IUSn into at least one pulse modulated signal PMS and at least one switching power stage SWP; SWP1 ... SWPn arranged to establish at least one amplified utility signal AUS on the basis of said at least one pulse modulated signal PMS and a power signal PS; PPS, NPS, said power signal being delivered by a tracking power supply TPS at least partly controlled by said at least one input utility signal IUS; IUS1 ... IUSn, characterized in that said switching amplifier is arranged to process said at least one input utility signal IUS; IUS1 ... IUSn according to a correction signal CS established by a correction signal estimator CSE on the basis of a supply information signal SIS derived from said tracking power supply TPS, an advantageous embodiment of the present invention is obtained.

According to the present invention an advantageous switching amplifier enabling use of a tracking power supply is provided. Thereby the many benefits of switching amplifiers can now be obtained together with the benefits of utilizing a tracking power supply. Among many things, this reduces power consumption, reduces EMI noise and enables using more of the dynamic range available for the utility signal during the pulse modulation. The last advantage further renders noise introduced by the power supply and the switching output stage less significant, as the signal-to-noise ratio in the power stage is greatly improved due to the utilization of the full dynamic range enabled by using a tracking power supply.

A switching amplifier may, according to the present invention, comprise any amplifier technology that in principle delivers an output that corresponds to the input utility signal and the power supply signal in a multiplicative way. Any kind, encoding, origin and representation of the input utility signal is within the scope of the present invention, e.g. analog or digital, encoded as PCM, MP3, etc., differential or single ended, electrical, optical or wireless, packet-based and/or real-time, single channel or multichannel etc., as long as the signal can be decomposed into one or more streams of consecutive values or continuous signals suitable for pulse modulation, e.g. pulse width modulation. In a preferred embodiment the input utility signal represents audio, and is meant for reproduction in loudspeakers subsequent to the amplification. The pulse modulators and pulse modulation may within the scope of the present invention comprise any suitable technology, but is preferably a kind of pulse width modulation. Any method of determining the switch times and generating the pulse modulated signal is within the scope of the present invention, e.g. analog comparator or hysteresis based modulation, self-oscillating modulation, digital processing and synthetic modulation, etc. Typically the switching power stage according to the invention comprises field-effect transistors, e.g. MOSFETs, e.g. arranged in a bridge configuration. In a preferred embodiment, the switching amplifier, in particular the pulse modulator and switching power stage is optimized for processing audio, i.e. arranged to altogether process an audio input signal as linearly as possible, except for any desired non-linear processing, e.g. limiting.

The switching amplifier may further within the scope of the present invention comprise additional components, e.g. processing of the utility signal before or after pulse modulation, e.g. in order to compensate for errors in the modulation stage and power stage, optimize the signal according to the loudspeakers if known, perform limiting, compression, coloration, etc., handle multi-channel issues such as cross-talk, handle switching power stage issues such as minimum pulse width capabilities, demodulating the pulse width modulated, amplified output signal, etc. The switching amplifier may further within the scope of the present invention be of an open-loop type without any feedback loop, or it may comprise a feedback loop e.g. around the switching power stage, possibly including a demodulator and/or the pulse modulator and/or any other processing elements, in order to suppress errors introduced by these components.

Any type of tracking power supply is within the scope of the present invention as long as the power signal PS supports the kind of switching power stage SWP applied, e.g. single-ended or differential. A preferred tracking power supply incorporates a switch mode power supply for controlling the delivered voltage, but any suitable technology is within the scope of the present invention. Any algorithm or method of at least partly tracking the input utility signal is within the scope of the present invention, and may be implemented by analog, digital or software means. It is noted that the term power signal in the present description is used to denote the actual power supply voltage and current delivered to the switching power stage. Even though the term signal often refers to information represented by a low-power electric signal, the term seem appropriate in the present context because the power signal, though typically high-powered, may comprise any suitable waveforms for voltage and current, and will actually vary at a relatively high rate, in particular with a fast and tight tracking algorithm.

The correction signal estimator may according to the present invention comprise any means for establishing a correction signal comprising information about how to change the input utility signal in order for compensating for the tracking and thereby varying power supply. The correction signal estimator at least partly works on the basis of information obtained from the tracking power supply signal transmitted to or from the tracking power supply.

When said correction signal CS is applied to said at least one input utility signal IUS; IUS1 . . . IUSn inside said at least one feedback loop, an advantageous embodiment of the present invention is obtained.

Also switching amplifiers with feedback can be implemented with tracking power supplies according to the present invention to obtain the benefits thereof. In such case, the correction signal should be applied within the feedback loop, as the varying supply voltage is also applied within the loop at the switching power stage, and the feedback loop will therefore not recognize and fight the reaction and action caused by the correction signal estimator and tracking power supply, respectively.

When said controlled power supply comprises a tracking power supply TPS comprising a level computer LC determining a desired power signal DPS, a supply pulse modulator SPM generating a modulated desired power signal MDPS a supply switching power stage SSW and a supply output filter SOF establishing said power signal PS; PPS, NPS, an advantageous embodiment of the present invention is obtained.

In a preferred embodiment of the invention, the tracking power supply works in principle as a switch mode power supply, but instead of maintaining a steady output voltage according to a reference, the level computer determines a desired power signal, i.e. voltage, or alternatively current, at least partly on the basis of, typically, the level of the one or more input utility signals. Any method or algorithm for tracking is within the scope of the present invention, as the present invention by means of the correction signal estimator provides for correcting supply voltage variances due to any tracking algorithm. The level computer and supply pulse modulator may be implemented by any technology, e.g. as mentioned above for the pulse modulators of the amplifiers.

When said level computer LC determines said desired power signal DPS at least partly on the basis of said at least one input utility signal IUS; IUS1 . . . IUSn according to a predetermined tracking algorithm, an advantageous embodiment of the present invention is obtained.

When said predetermined tracking algorithm applies a lower threshold, e.g. corresponding to 10% of the dynamic range, an advantageous embodiment of the present invention is obtained.

According to a preferred embodiment of the invention, the tracking algorithm should not allow the supply voltage to drop below a certain voltage, as switching output stages typically not works below a minimum supply voltage. In a preferred embodiment the threshold is set to 10% of the dynamic range, but obviously this level should be optimized to the actual implementation, scaling and switching power stages utilized, within the scope of the present invention.

When said predetermined tracking algorithm applies a bandwidth limiter, e.g. corresponding to 1 kHz or 10% of the bandwidth of said tracking power supply TPS, an advantageous embodiment of the present invention is obtained.

According to a preferred embodiment of the invention, the output signal of the tracking algorithm, i.e. the desired power signal representation should not comprise fast changes, e.g. corresponding to frequency components of above 10% of the bandwidth of the tracking power supply or e.g. 1 kHz, as simulations show that the correction according to the present invention of the varying supply voltage due to the necessary prediction, etc., works best for changes with frequency components below 10 kHz. Obviously, in embodiments with better prediction capabilities and higher tracking power supply bandwidth, a higher bandwidth limit can be applied by the level computer, within the scope of the present invention.

When said predetermined tracking algorithm comprises an attack/decay filter, an advantageous embodiment of the present invention is obtained.

When said supply information signal SIS comprises at least one of said desired power signal DPS, said modulated desired power signal MPDS, said power signal PS; PPS, NPS and a power signal reference PSR, an advantageous embodiment of the present invention is obtained.

Different signals may be used for establishing the correction signal in different embodiment. In a preferred embodiment of the present invention, the correction signal is established on the basis of the desired power signal DPS, the modulated desired power signal MDPS, the actually established power signal PS and a power signal reference PSR, but in other embodiments within the scope of the present invention, the correction signal is established simply from the desired power signal DPS and the power signal reference PSR, or from the power signal PS and the power signal reference PSR. Any other use of signals is within the scope of the present invention.

When said ratio circuit RC; RC1, RC2 is arranged to determine a ratio of a power signal reference PSR by a desired power signal DPS, an advantageous embodiment of the present invention is obtained.

According to a preferred embodiment a ratio circuit for determining the ratio between a power signal reference and a desired power signal is preferably implemented by software or logics, i.e. digitally, as the desired power signal is preferably a digital signal or a value in a register.

When said ratio circuit RC; RC1, RC2 is arranged to determine a ratio of a power signal reference PSR by said power signal PS; PPS, NPS, an advantageous embodiment of the present invention is obtained.

According to a preferred embodiment a ratio circuit for determining the ratio between a power signal reference and a power signal is preferably implemented by analog circuitry as the power signal is an analog signal. In a preferred embodiment the analog ratio circuitry is arranged to output the ratio as a digital representation. In an alternative embodiment the power signal is converted into a digital signal and the ratio circuit implemented digitally.

When said ratio circuit RC; RC1, RC2 is arranged to determine a ratio of a modulated desired power signal MDPS by said power signal PS; PPS, NPS, an advantageous embodiment of the present invention is obtained.

According to a preferred embodiment of the present invention a ratio circuit for determining the ratio between a modulated desired power signal and a power signal is preferably implemented by analog circuitry as both the modulated desired power signal and the power signal are analog signals. In a preferred embodiment the analog ratio circuitry is arranged to output the ratio as a digital representation. In an alternative embodiment the signals are converted into digital signals and the ratio circuit implemented digitally.

When said ratio circuit RC; RC1, RC2 comprises a pulse modulated ratio circuit PMRC and a decimation circuit DC, an advantageous embodiment of the present invention is obtained.

A very advantageous embodiment of an analog implementation of a ratio circuit, which establishes the output ratio as a digital representation, is obtained according this preferred embodiment of the present invention.

When said processing of said input utility signal IUS according to said correction signal CS comprises multiplying said input utility signal with said correction signal, an advantageous embodiment of the present invention is obtained.

In a preferred embodiment of the present invention, the correction signal is encoded as a correction factor so that it can easily be multiplied with the input utility signal. This embodiment is very advantageous, as the error is in nature a factor due to the switching amplifier's multiplicative working principle, and a correction factor is therefore relative easily determined and applied to the utility signal without considering the different signal scales, absolute values, dynamic ranges, etc. Furthermore, multiplication is easily performed, in particular for digital signals.

When the switching amplifier processes at least one optimized utility signal OUS according to a power signal PS, comprising at least one dynamics optimizer DO arranged to establish said at least one optimized utility signal OUS on the basis of least one input utility signal IUS; IUS1 . . . IUSn and a variable power supply VPS establishing said power signal PS at least partly controlled by a correction signal CS established on the basis of a gain factor GF derived from said dynamics optimizer DO, an advantageous embodiment of the present invention is obtained.

When the switching amplifier comprises at least one dynamics optimizer DO arranged for changing the dynamics of at least one input utility signal IUS; IUS1 . . . IUSn in order to establish at least one optimized utility signal OUS, at least one pulse modulator PM; PM1 . . . PMn arranged for modulating said at least one optimized utility signal OUS into at least one pulse modulated signal PMS and at least one switching power stage SWP; SWP1 . . . SWPn arranged to establish at least one amplified utility signal AUS on the basis of said at least one pulse modulated signal PMS and a power signal PS; PPS, NPS, said power signal being delivered by a variable power supply VPS at least partly controlled by a correction signal CS established by a correction signal estimator CSE on the basis of a gain factor GF derived from said dynamics optimizer DO, an advantageous embodiment of the present invention is obtained.

When said switching amplifier comprises at least one feedback loop at least comprising said at least one switching power stage SWP; SWP1 . . . SWPn, and wherein said dynamics optimizer DO is located inside said at least one feedback loop, an advantageous embodiment of the present invention is obtained.

Also switching amplifiers with feedback can be implemented with optimization of dynamics and variable power supplies according to the present invention to obtain the benefits thereof. In such case, the dynamics optimizer should be located within the feedback loop, as the consequentially varying supply voltage is also applied within the loop at the switching power stage, and the feedback loop will therefore not recognize and fight the reaction and action caused by the dynamics optimizer and tracking power supply, respectively.

When said controlled power supply comprises a variable power supply VPS, an advantageous embodiment of the present invention is obtained.

In a preferred embodiment of the invention, the variable power supply works in principle as a switch mode power supply, but instead of maintaining a steady output voltage according to a reference, a desired power signal, i.e. voltage, or alternatively current, is determined at least partly on the basis of a correction signal input. Any method or algorithm for implementing this control is within the scope of the present invention. The supply pulse modulator may be implemented by any suitable technology, e.g. as mentioned above for the pulse modulators of the amplifiers.

The present invention further relates to a method of driving a switching amplifier by a tracking power supply TPS, whereby at least one input utility signal IUS; IUS1 . . . IUSn is amplified, characterized by a correction signal CS being established by a correction signal estimator CSE on the basis of a supply information signal SIS derived from said tracking power supply TPS, and whereby said at least one input utility signal IUS; IUS1 . . . IUSn is processed according to said correction signal CS prior to said amplification.

According to the present invention an advantageous method of driving switching amplifiers by use of tracking power supplies is provided. The method enables many benefits of switching amplifiers to be obtained together with the benefits of utilizing a tracking power supply. Among many things, this reduces power consumption, reduces EMI noise and enables using more of the dynamic range available for the utility signal during the pulse modulation. The last advantage further renders noise introduced by the power supply and the switching output stage less significant, as the signal-to-noise ratio in the power stage is greatly improved due to the utilization of the full dynamic range enabled by using a tracking power supply.

A switching amplifier may, according to the present invention, comprise any amplifier technology that in principle delivers an output that corresponds to the input utility signal and the power supply signal in a multiplicative way. Any kind, encoding, origin and representation of the input utility signal is within the scope of the present invention. In a preferred embodiment the input utility signal represents audio, and is meant for reproduction in loudspeakers subsequent to the amplification.

Any type of tracking power supply is within the scope of the present invention as long as the power signal PS supports the kind of switching power stage SWP applied, e.g. single-ended or differential. A preferred tracking power supply incorporates a switch mode power supply for controlling the delivered voltage, but any suitable technology is within the scope of the present invention. Any algorithm or method of tracking the input utility signal is within the scope of the present invention.

The correction signal estimator may according to the present invention comprise any means for establishing a correction signal comprising information about how to change the input utility signal in order for compensating for the tracking and thereby varying power supply. The correction signal estimator at least partly works on the basis of information obtained from the tracking power supply signal transmitted to or from the tracking power supply.

The present invention further relates to a method of optimizing dynamics in a switching amplifier amplifying at least one input utility signal IUS; IUS1 . . . IUSn whereby an optimized utility signal OUS is established by changing dynamics of said input utility signal IUS; IUS1 . . . IUSn, and a correction signal CS is established on the basis of information related to said changed dynamics and used to control a power signal PS on which amplification of said optimized utility signal OUS is based.

According to the present invention an advantageous method of improving dynamics within switching amplifiers by use of variable power supplies is provided. The method enables many benefits of switching amplifiers to be obtained together with the benefits of better dynamics and variable power supplies. Among many things, this reduces power consumption, reduces EMI noise and enables using more of the dynamic range available for the utility signal during the pulse modulation. The last advantage further renders noise introduced by the power supply and the switching output stage less significant, as the signal-to-noise ratio in the power stage is greatly improved due to the utilization of the full dynamic range enabled by using a variable power supply.

A switching amplifier may, according to the present invention, comprise any amplifier technology that in principle delivers an output that corresponds to the input utility signal and the power supply signal in a multiplicative way. Any kind, encoding, origin and representation of the input utility signal is within the scope of the present invention. In a preferred embodiment the input utility signal represents audio, and is meant for reproduction in loudspeakers subsequent to the amplification.

Any type of variable power supply is within the scope of the present invention as long as the power signal PS supports the kind of switching power stage SWP applied, e.g. single-ended or differential. A preferred variable power supply incorporates a switch mode power supply for controlling the delivered voltage, but any suitable technology is within the scope of the present invention. Any algorithm or method of controlling the power signal is within the scope of the present invention.

The correction signal estimator may according to the present invention comprise any means for establishing a correction signal comprising information about how to change the power signal in order for compensating for the optimization performed on the input utility signals.

The present invention further relates to a use of a pulse modulated ratio circuit PMRC in a switching amplifier driven by a controlled power supply TPS; VPS.

Figure 10:
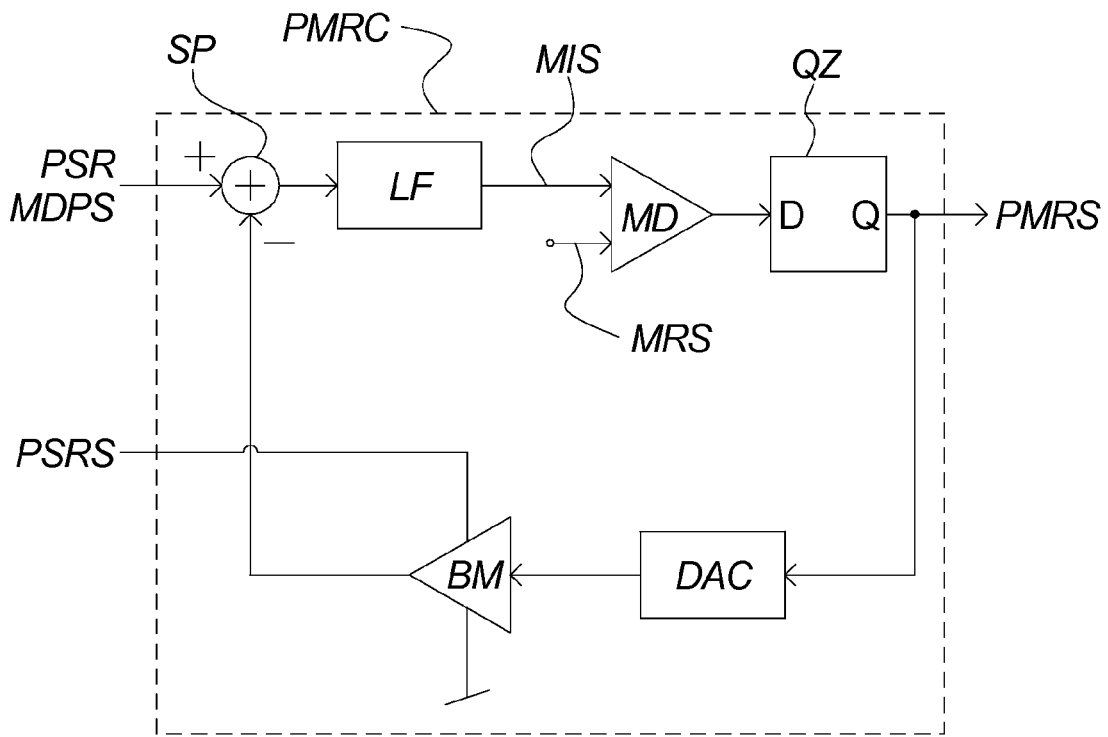

According to the present invention, a new and advantageous use of a pulse modulated ratio circuit, e.g. as illustrated in FIG. 10, is obtained. When combining a switching amplifier with e.g. a tracking power supply or a dynamics optimizer, some means for correction the input utility signal according to the varying, i.e. tracking, supply voltage or the optimized utility signal, respectively, has to be implemented. In e.g. the case where a ratio indicating the difference between the actually applied supply voltage, and e.g. the reference voltage corresponding to full dynamic range, is desired for establishing an accurate correction, a pulse modulated ratio circuit can advantageously be used as it provides for establishing a digitally represented ratio between two analog signals in a very fast and accurate way.

THE DRAWINGS

Figure 2:
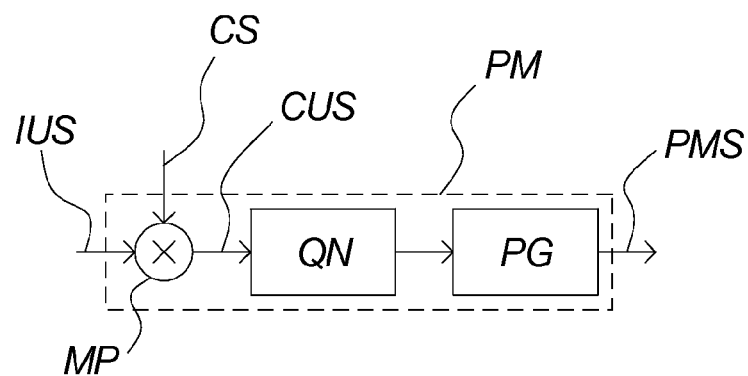
Figure 3:
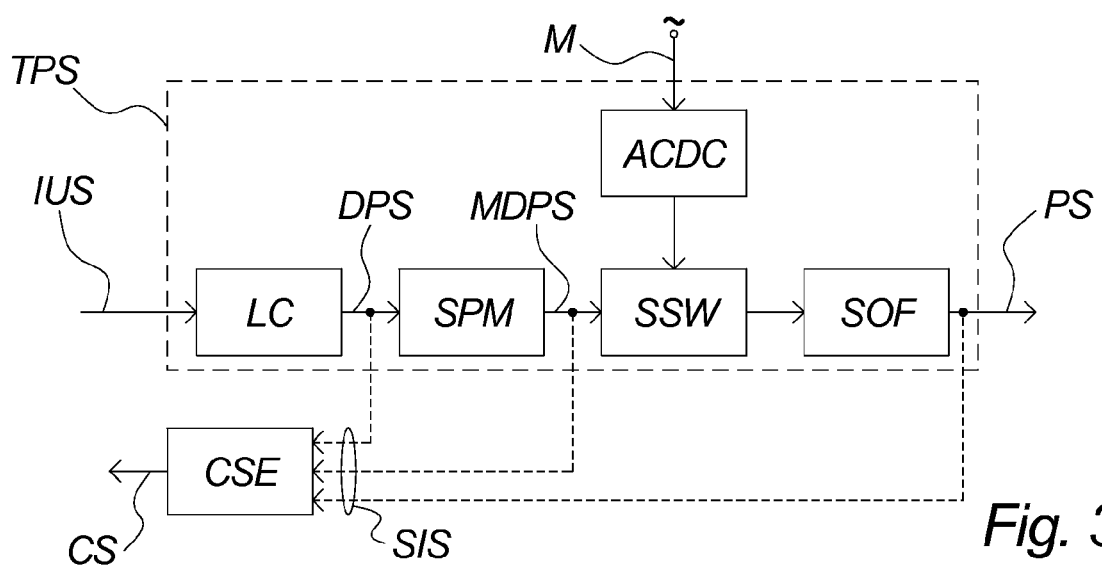
Figure 4:
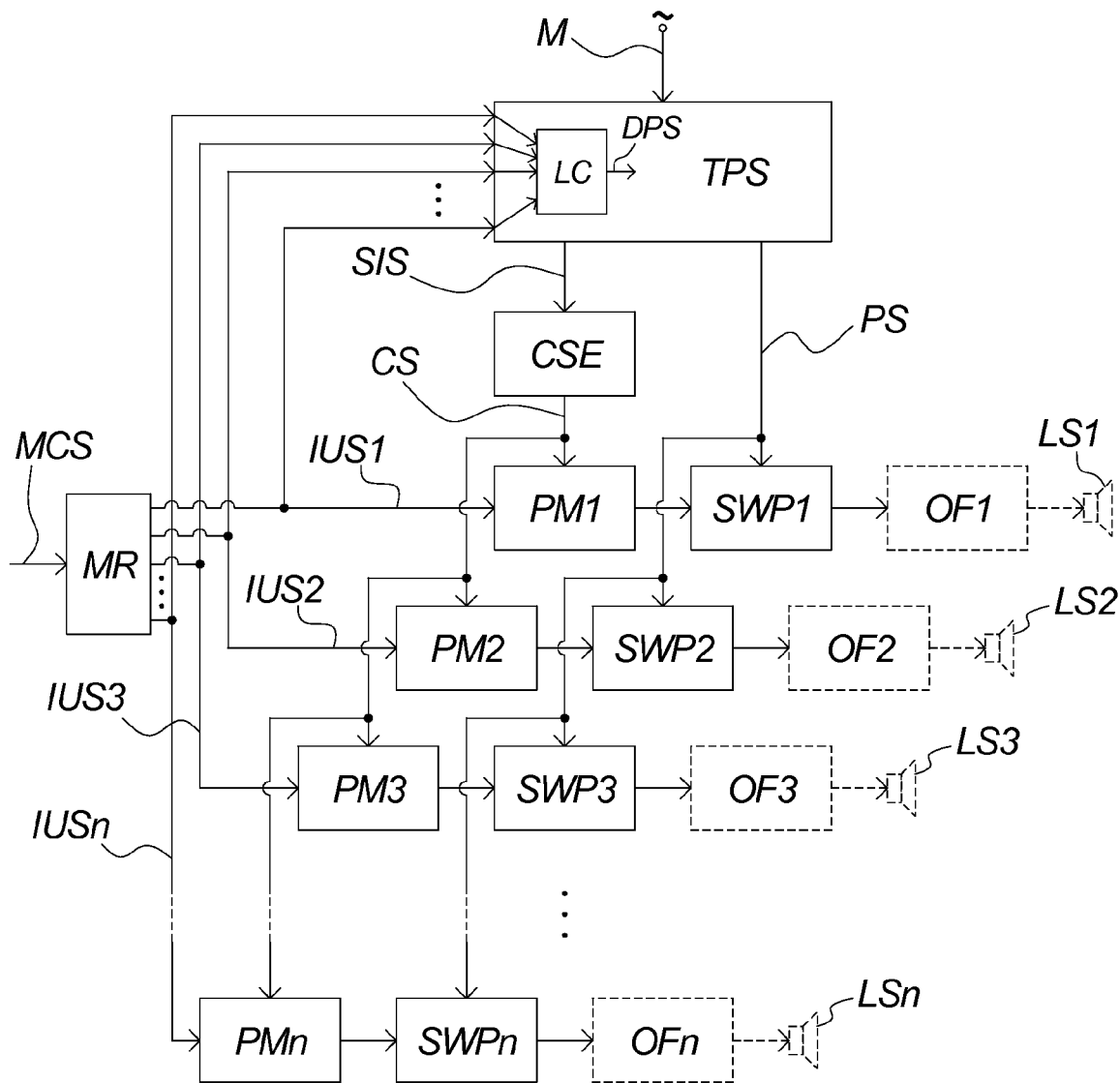
Figure 5:
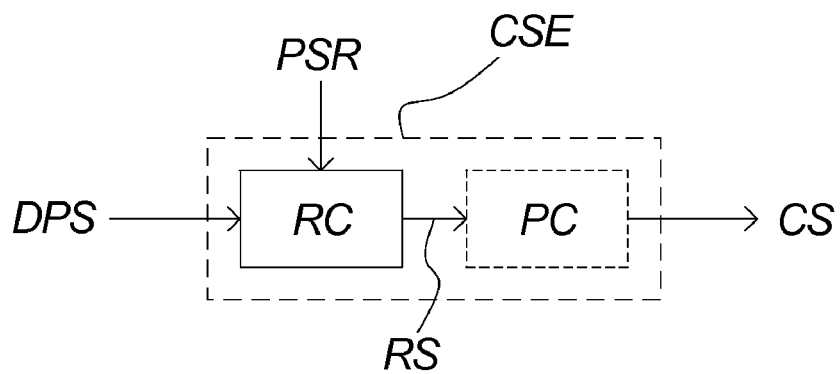
Figure 6:
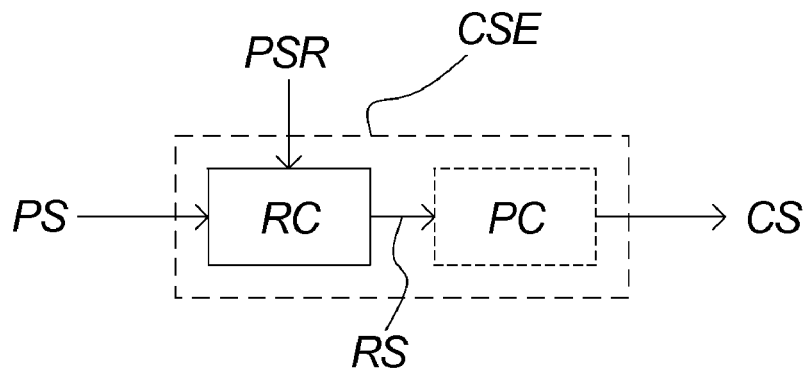
Figure 7:
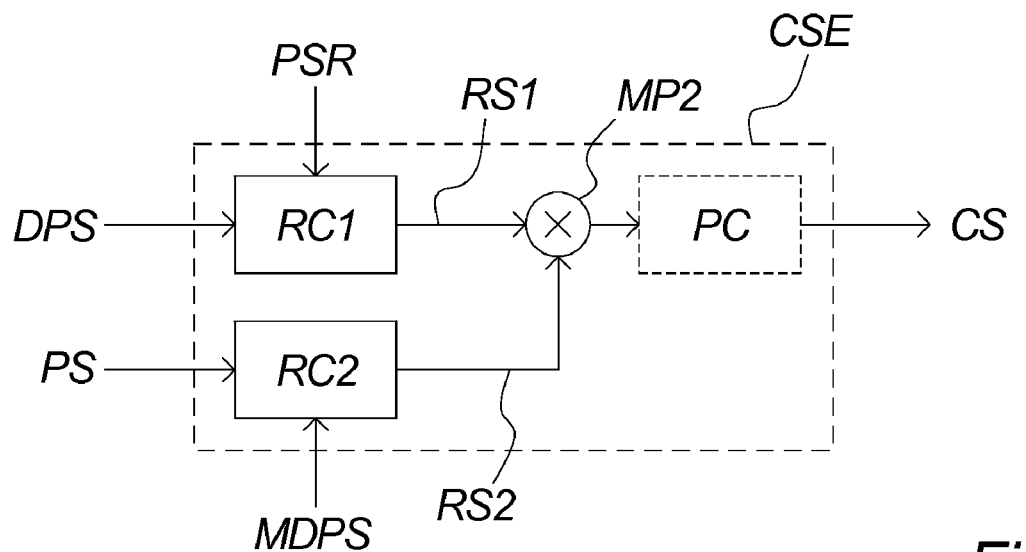
Figure 8:
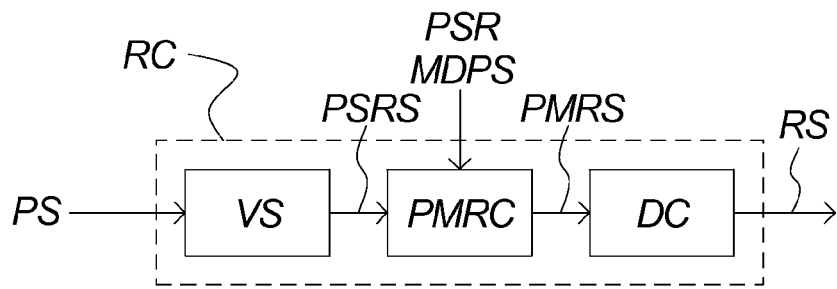
Figure 9:
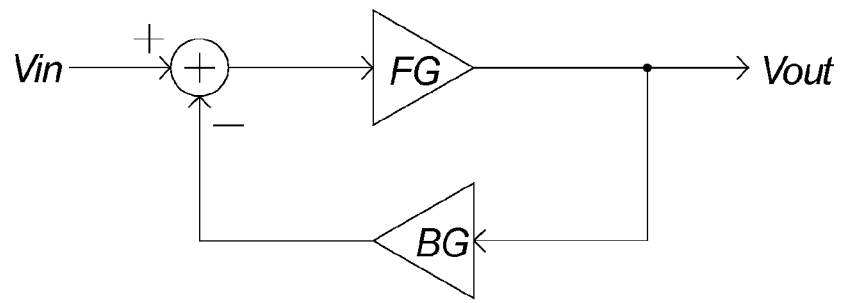
Figure 11:
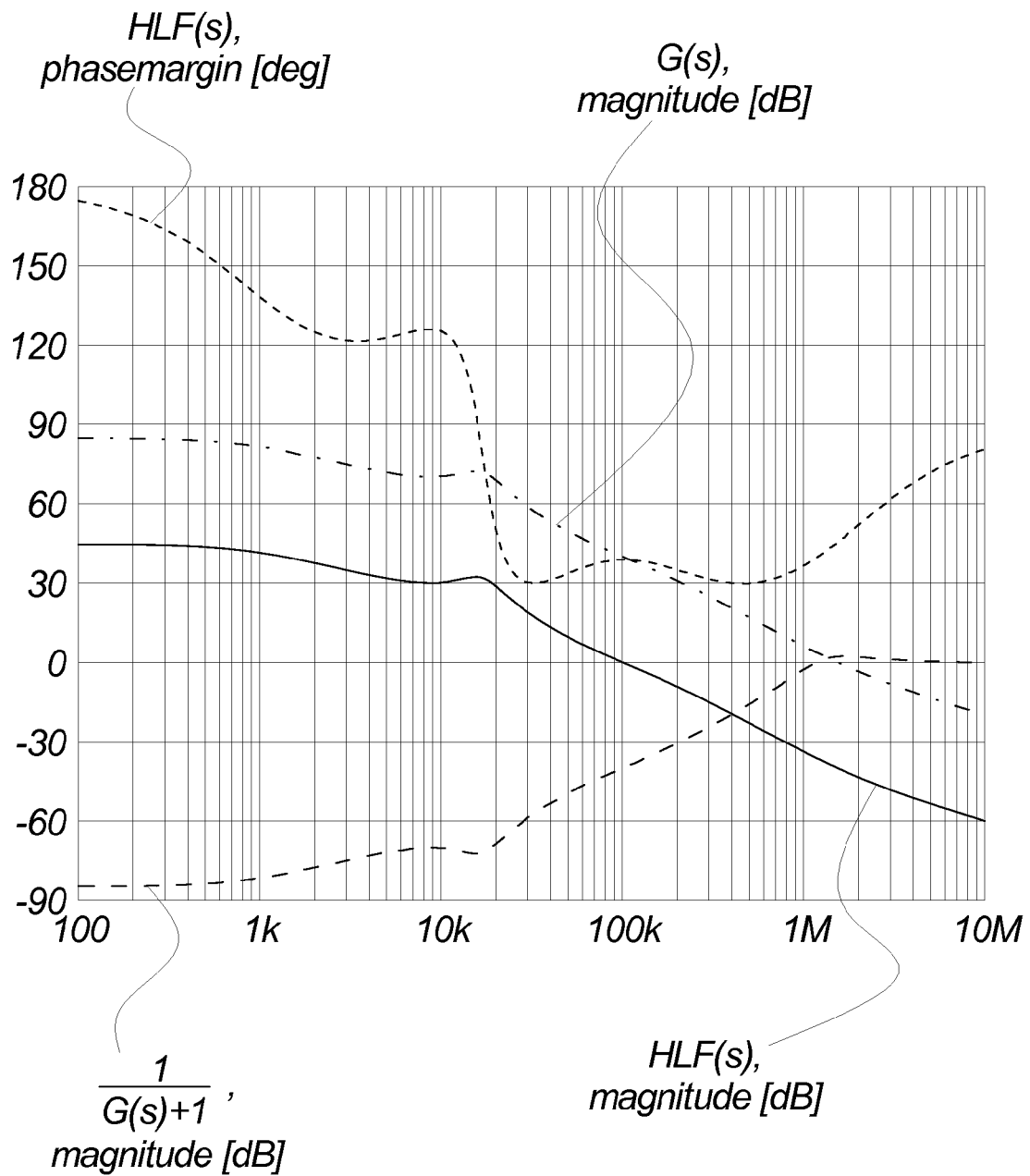
Figure 15:
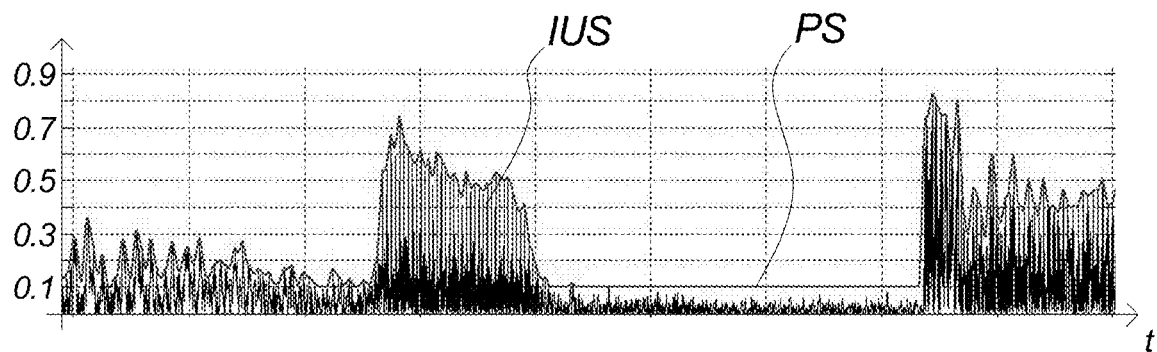
Figure 16:
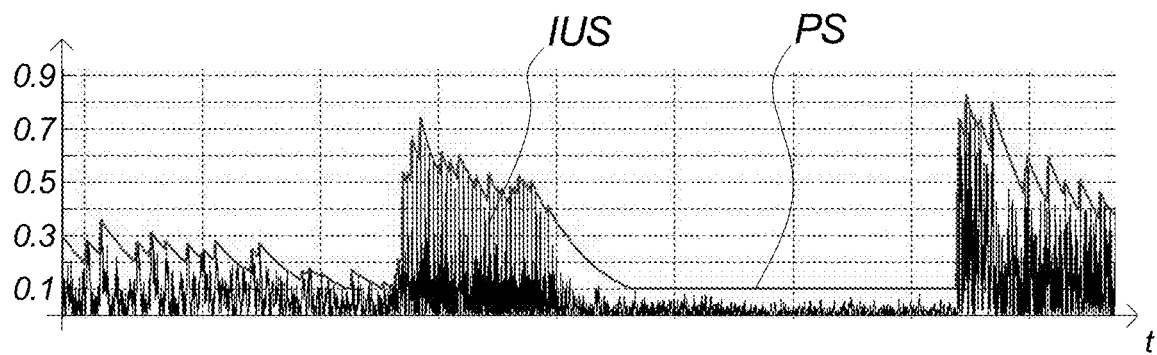
Figure 17:
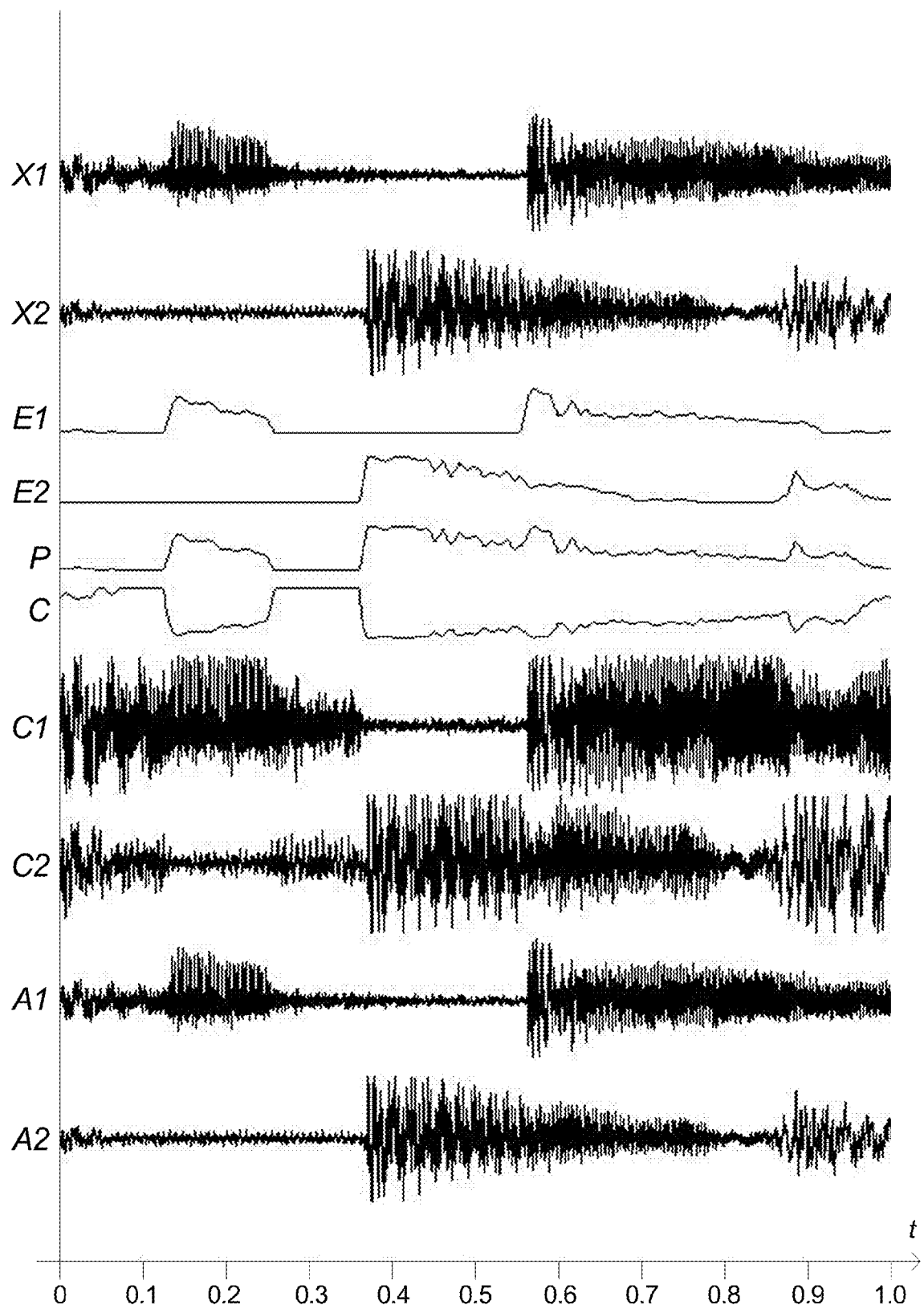
Figure 18:
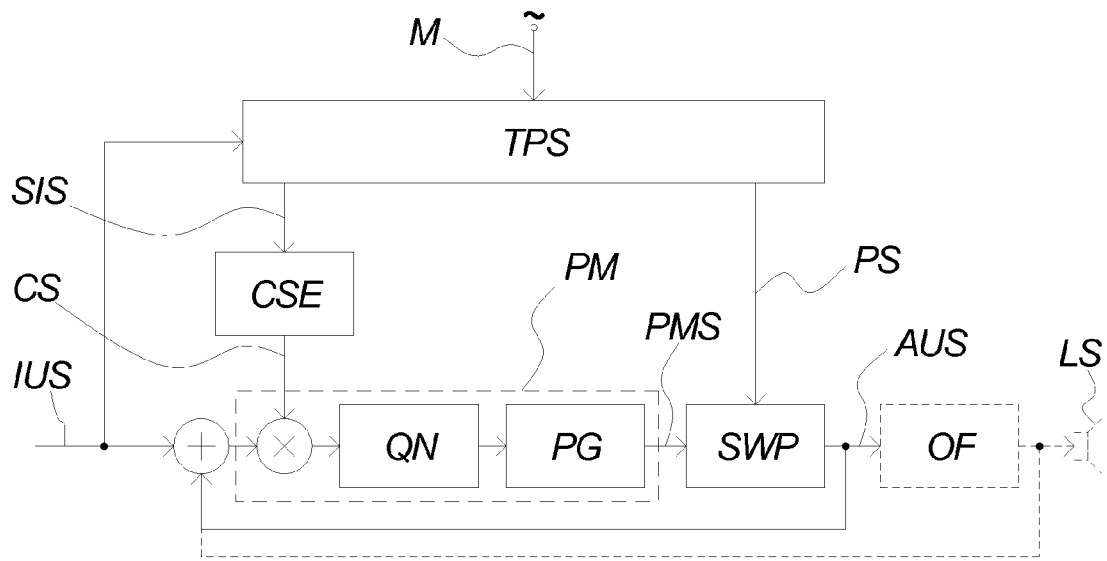
Figure 19:
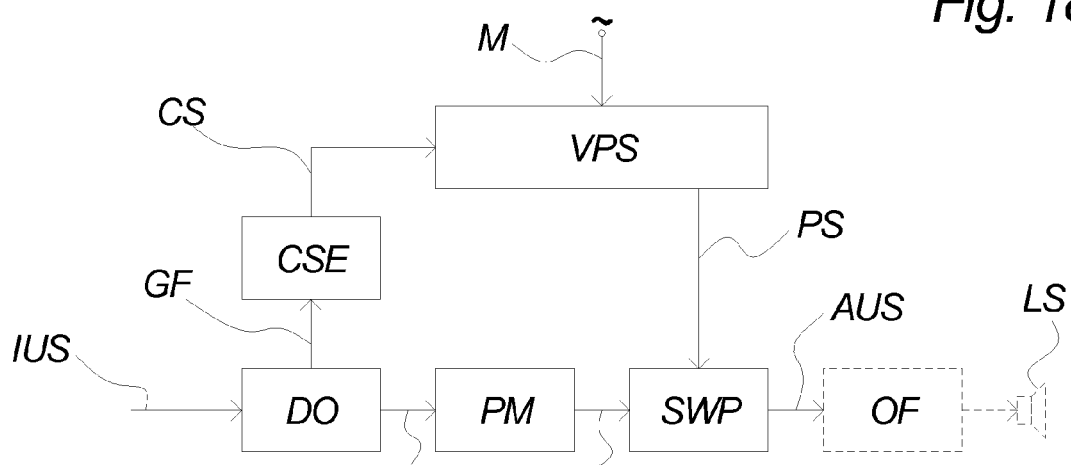
Figure 20:
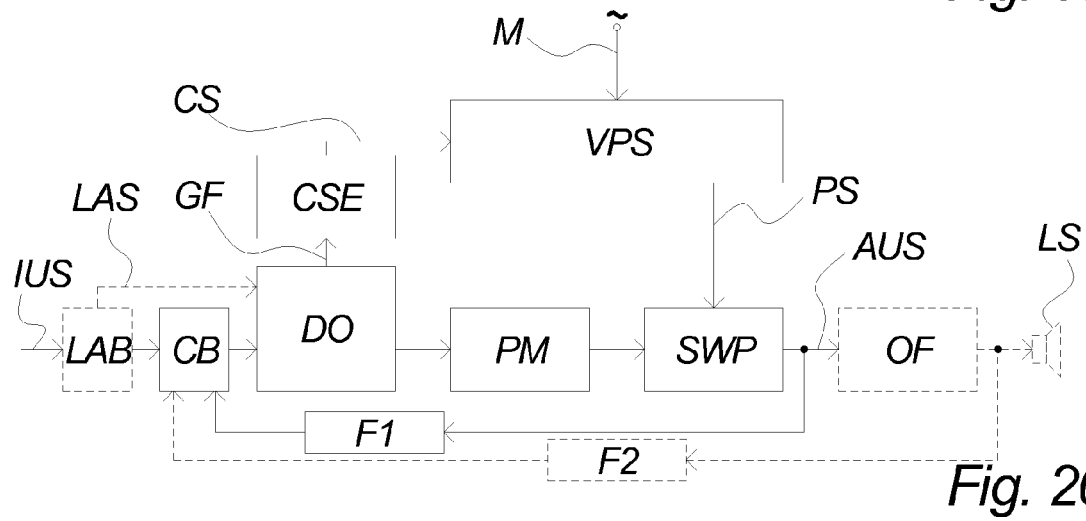
Figure 21:
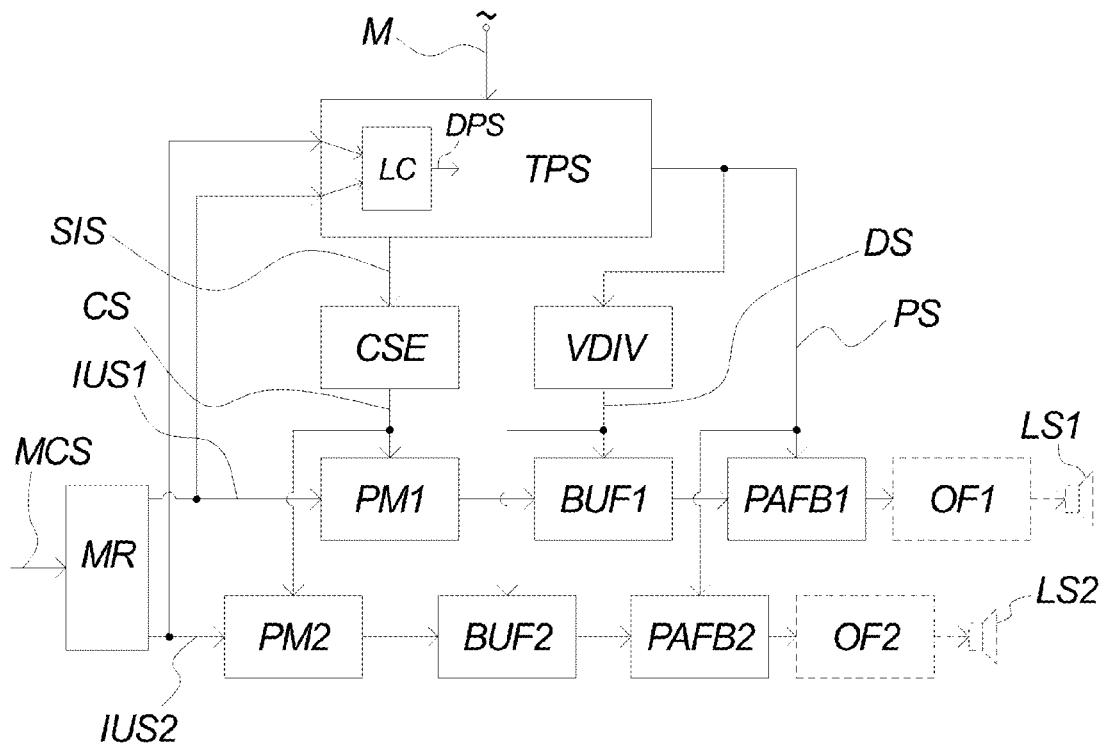
Figure 22:
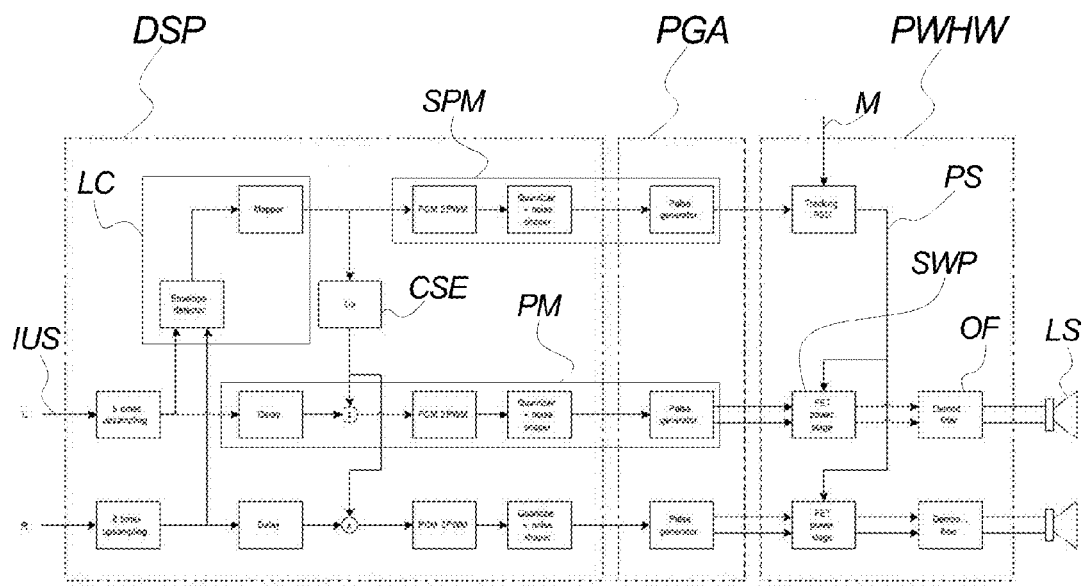
Figure 23:
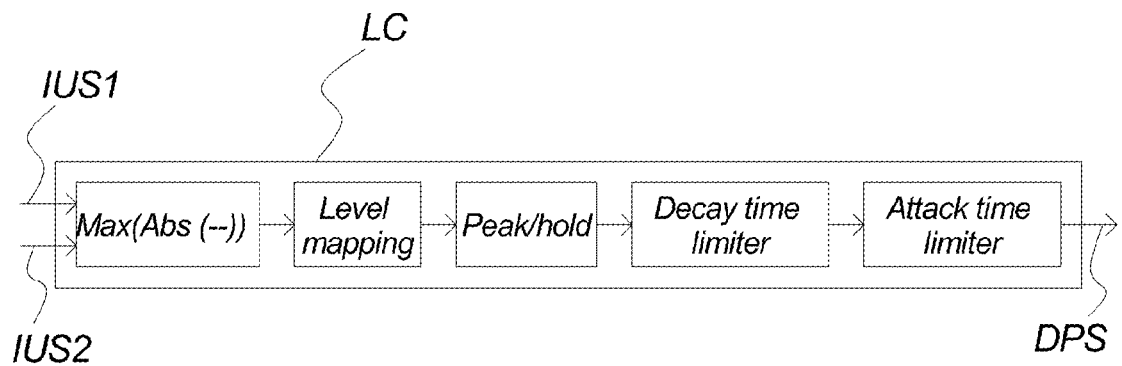
Figure 24:
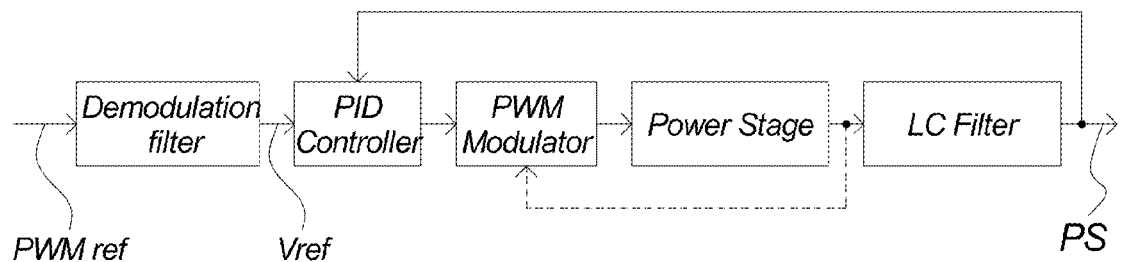

The invention will in the following be described with reference to the drawings where FIG. 1 illustrates an embodiment of a switching amplifier according to the present invention, FIG. 2 illustrates an embodiment of a pulse modulator, FIG. 3 illustrates an embodiment of a tracking power supply, FIG. 4 illustrates an embodiment of a multichannel switching amplifier according to the present invention, FIG. 5-7 illustrate embodiments of correction signal estimators according to the present invention, FIG. 8 illustrate an embodiment of a ratio circuit according to the present invention, FIG. 9 illustrates a principle of feedback filters, FIG. 10 illustrates an embodiment of a pulse modulated ratio circuit according to the present invention, FIG. 11 illustrates properties of a loop filter, FIG. 12-16 illustrate results of different level computer embodiments, FIG. 17 illustrates examples of actual signals in an amplifier according to an embodiment of the present invention, FIG. 18-20 illustrate embodiments of switching amplifiers according to the present invention, and FIG. 21 illustrates a preferred embodiment of the present invention, FIG. 22 illustrates how different parts of an embodiment are preferably implemented, FIG. 23 illustrates steps performed by an embodiment of a level computer, FIG. 24 illustrates an embodiment of a tracking power supply with feedback loops, and FIG. 25 comprises schematics for the embodiment of FIG. 24.

DETAILED DESCRIPTION

FIG. 1 illustrates an embodiment of a switching amplifier according to the present invention. An input utility signal IUS is turned into a pulse modulated signal PMS by a pulse modulator PM. A switching power stage SWP establishes an amplified utility signal AUS on the basis of the pulse modulated signal PMS. In a typical embodiment, an output filter OF further demodulates the pulsed amplified utility signal AUS for reproduction by e.g. a loudspeaker LS. In a preferred embodiment the input utility signal is an audio signal, and the amplifier optimised for audio.

The pulse modulator PM and switching power stage SWP may as long as they together carry out a kind of multiplication between the power supply voltage and input utility signal comprise any class-D or switching amplifier technology, based on any type of pulse modulation, e.g. 2-level PWM, 3-level PWM, multilevel PWM, PDM, etc., any type of switching power stage, e.g. full-bridge, half-bridge, single-ended, differential, etc, any type of encoding of the input utility signal, e.g. analog or digital, PCM, etc., and any type of pulse establishing algorithm, e.g. based on analog comparators, digital calculations, etc. The pulse modulator PM may further comprise any kind of pre- or post-processing of the input signal, any intermediate signals, or the pulse modulated signal, e.g. processing to avoid extremely narrow pulses, to avoid concurrent flanks in two or more channels, to compensate for known errors in the power stage, etc.

According to the present invention, the switching power stage SWP is driven by a power signal PS established by a tracking power supply TPS, which is itself supplied by mains M or another power supply, possibly battery driven. A tracking power supply monitors the input utility signal and delivers a power signal PS that varies with the input utility signal according to some predefined algorithm, and thereby delivers only the power necessary for the actual amplification task at the current moment, with the advantages of power saving, EMI noise reduction, etc. In an extreme case, the supply voltage delivered by a tracking power supply would be 0V, or in practice a very small voltage as switching power stages need a little voltage to operate at all, when the input utility signal is silent, thereby causing practically no power to be consumed, and no noise to be emitted. The concept works because in a switching amplifier the multiple of a certain utility signal value and the supply voltage can also be achieved by multiplying a higher utility signal value with an accordingly lower supply voltage. Thus, by always varying the supply voltage to a value where a corresponding increase in utility signal value approaches the clip value, the highest possible utility signal value is always multiplied with the lowest possible supply voltage, and noise and power dissipation are reduced.

Any type of tracking power supply is within the scope of the present invention as long as the power signal PS supports the kind of switching power stage SWP applied, e.g. single-ended or differential. Due to energy loss and efficiency considerations, a preferred tracking power supply incorporates a switch mode power supply for controlling the delivered voltage, but any suitable technology is within the scope of the present invention.

As mentioned above, because of the tracking power supply, the power signal PS voltage varies. In order to obtain the desired amplified utility signal AUS, the utility signal should be varied inversely. According to the present invention this is done by a correction signal estimator CSE which based on a supply information signal SIS establishes a correction signal CS that is provided to the pulse modulator PM. The correction signal CS is preferably a factor representing the reciprocal of the power signal PS voltage delivered by the tracking power supply TPS. For example, if the voltage of the power signal is half the reference or maximum power signal voltage, the correction signal CS should comprise a factor representing the reciprocal of ½, i.e. 2, which should be multiplicatively applied to the input utility signal to double it before the amplification. The resulting amplified utility signal would then be half supply voltage multiplied with double utility signal, which corresponds to full supply voltage multiplied with the original utility signal.

Any method of establishing a suitable correction signal CS on the basis of information from the tracking power supply TPS which is able to cause a variation of the utility signal inversely corresponding to the variations of the power signal, is within the scope of the present invention, and several possible embodiments of a correction signal estimator CSE will be described below.

FIG. 2 illustrates in more detail an embodiment of a pulse modulator PM suitable for use in an embodiment of the present invention. It is emphasized, however, as also mentioned above, that any kind of pulse modulator and switching amplifier technology is within the scope of the present invention. The embodiment of FIG. 2 is merely provided as one simple example embodiment in order to clarify how the invention works. The pulse modulator embodiment of FIG. 2 comprises a quantizing and noise shaping block QN and a pulse generator PG. In this embodiment, the correction signal CS described above is preferably multiplied to the input utility signal IUS by a multiplication point MP to establish a corrected utility signal CUS prior to the pulse modulation blocks.

FIG. 3 illustrates in more detail an embodiment of a tracking power supply TPS suitable for use in an embodiment of the present invention. It is emphasized, however, as also mentioned above, that any kind of tracking power supply technology is within the scope of the present invention. The embodiment of FIG. 3 is merely provided as one simple example embodiment in order to clarify how the invention works. The tracking power supply embodiment of FIG. 3 comprises a level computer LC which receives the input utility signal, or a representation thereof. On the basis of the utility signal and some predefined algorithm or set of rules the level computer LC establishes a desired power signal representation DPS which represent the supply voltage that the level computer determines would be appropriate to use with the present utility signal. Any suitable algorithm, rules, filters, etc., for determining what power signal would be appropriate is within the scope of the present invention, and a few examples will be described below. The desired power signal representation DPS is preferably a normalized signal in the sense that a value of 1 means that full supply voltage is desired, and a value of 0 means that a supply of 0V is desired. The desired power signal representation DPS is pulse modulated by a supply pulse modulator, which may work by any pulse modulation principle, but preferably modulates into 2-level PWM. The resulting modulated desired power signal MDPS is used to modulate a substantially constant DC supply voltage, which is demodulated by a supply output filter SOF. The substantially constant DC supply voltage is preferably generated from an AC supply, e.g. mains M, by a conventional AC/DC converter, but may also be driven by a battery or other power source.

As seen, except from the level computer LC, the tracking power supply TPS could be implemented as any switch-mode power supply. Alternatively, a conventional power supply with two or more power rails at different potential and the possibility to let a level computer LC select a power rail according to the current input utility signal could be used, as could any other power supply with controllable, variable output voltage, e.g. DC/DC converters, power converters, etc.

Several signals within the tracking power supply TPS can be used for determining the correction signal CS. The supply information signal SIS delivered to the correction signal estimator CSE could therefore comprise one or more of the desired power signal DPS, the modulated desired power signal MDPS, the power signal PS, or any other relevant signal. Connections from these signals to the correction signal estimator are thus indicated by dashed lines in FIG. 3.

FIG. 4 illustrates a preferred embodiment of the present invention. It comprises a multichannel power amplifier driven by a tracking power supply TPS. Compared to a single channel switched amplifier with tracking power supply as illustrated in FIG. 1, the multichannel implementation brings a couple of further considerations, in that the tracking power supply should track the input utility signal of all channels, and the input utility signal of all channels should be corrected accordingly. In FIG. 4 a multichannel signal MCS is delivered to a multichannel receiver MR which splits the multichannel signal into individual input utility signals IUS1, IUS2, IUS3 . . . IUSn, corresponding to n individual channels. The multichannel signal may itself comprise individual signals for each channel, or it may comprise several channels multiplexed or encoded into a single or a few wires. In fact, any suitable technology for providing multiple channels, analog or digital, electrical or optical, wired or wireless, etc., is within the scope of the present invention.

The input utility signals IUS1, IUS2, IUS3 . . . IUSn are fed to corresponding chains of pulse modulators PM1, PM2, PM3 . . . PMn, switched power stages SWP1, SWP2, SWP3 . . . SWPn, output filters OF1, OF2, OF3 . . . OFn and loudspeakers LS1, LS2, LS3 . . . LSn. The power signal PS from the tracking power supply TPS is delivered to all switched power stages, and as all power stages receives the same power signal, only one correction signal CS has to be established, common for all input utility signals. Therefore the multichannel embodiment of FIG. 4 only comprises one tracking power supply TPS, one power signal PS, one correction signal estimator CSE and one correction signal CS.

In order for the tracking power supply to be able to establish a power signal suitable for use with all channels simultaneously, the level computer LC establishes a desired power signal representation DPS on the basis of all input utility signals or representations thereof. In a preferred embodiment, the level computer simply chooses the highest value of any input utility signal at the current moment and uses it for establishing the desired power signal representation DPS in the same way as it would have operated on a single input utility signal. Obviously, with a multichannel amplifier the benefits of using a tracking power supply will be somewhat smaller than with a tracking power supply for each channel, as the power signal will have to correspond to the common denominator of the channels. However, as the envelopes of the different channels of many kinds of audio signals will actually vary somewhat similarly, e.g. silence or quiet music in all channels simultaneously, the benefits are still significant, even for several amplifiers operated by a common tracking power supply. The main advantage is that a single power supply can drive all channels, and practice shows that the level of all channels are typically very correlated, e.g. because the volume control typically works equally on all channels. At normal listening-level, e.g. −20 dBFS, the tracking power supply may be able to decrease the supplied voltage to as little as e.g. 10% of the maximum or nominal voltage.

Obviously, the benefits of a 90% voltage decrease are great, and even cause the loss in the switching power stages of the amplifier to be zero. However, there will still be some loss in the power supply switching stage.

FIG. 5-7 illustrate different embodiments of a correction signal estimator CSE.

In FIG. 5 a ratio circuit RC determines the ratio of a power signal reference PSR to a desired power signal representation DPS, and delivers a ratio signal RS, which can be used as correction signal CS directly, or can be further processed by a prediction circuit PC. Provided that the tracking power supply is able to generate a power signal PS accurately corresponding to the desired power signal representation DPS, or provided the errors introduced by the power supply are considered insignificant, the desired power signal representation DPS can be used instead of measuring the actual power signal PS voltage. And if the desired power signal representation DPS is a normalized signal as described above, in the sense that a value of 1 means that full supply voltage is desired, and a value of 0 means that a supply of 0V is desired, a power signal reference PSR of 1 will establish the appropriate correction signal CS. For example, if the desired power signal representation DPS is 0.8 to indicate that the power signal voltage should be four fifths of the nominal voltage, e.g. 24 V instead of a nominal 30 V, and the power signal reference, which should represent the maximum or nominal supply voltage, in this example 30V, is 1, the ratio signal RS, and thereby possibly the correction signal CS, would become 1/0.8=1.25. By multiplying this value with the input utility signal, thereby making its value 25 percents higher, the output of the amplifier, which in principle multiplies the supply voltage with the utility signal, 24*1.25=30, would be the same as when the original utility signal is multiplied with a supply voltage of 30 V, i.e. 30*1=30.

In case the desired power signal representation DPS is not a value between 0 and 1, e.g. if it is an analog signal between 0V and 5V, or a digital value explicitly stating the desired voltage, e.g. 24, the power signal reference PSR should be provided accordingly, e.g. as a 5V signal in the first case, and a digital value of 30 in the second case. The power supply reference PSR could also be derived from the output of the constant DC supply ACDC, as that voltage represents the maximum output voltage of the switch-mode power supply, but it should be considered that this voltage does not necessarily represent the voltage by which the amplifiers would multiply the maximum input utility signal value possible, and is therefore not necessarily directly usable.

Any embodiment of the ratio circuit RC establishing the ratio RS=PSR/DPS is within the scope of the present invention. Hence the division could be implemented in digital or analog domains by any suitable means. The ratio circuit preferably performs a division by means suitable for the domain and kind of the two input signal PSR and DPS.

In a preferred embodiment of the invention, a prediction circuit PC is provided for post processing the ratio signal RS before it is applied to the input utility signal as a correction signal CS. As delays in the tracking power supply TPS and in the pulse modulator PM and switching power stage SWP makes it improbable that the input utility signal value, on which the correction signal is based, corresponds in time to the input utility signal which will be amplified by the power signal established accordingly. In other words, at the time the correction signal CS is applied to the input utility signal IUS, there may still be a few nano- or even milliseconds before the corrected utility signal CUS is pulse modulated and delivered to the switching amplifier. If the delays in the tracking power supply for establishing a power signal voltage from a certain input utility signal value differs from the delays in the amplifier for establishing a pulse modulated signal PMS value from the same input utility signal value, the correction signal CS should be either delayed or brought forward accordingly, so that the input utility signal value is corrected by a signal actually representing as accurate as possible the power signal which will be used for amplifying that utility signal value. The prediction means may e.g. predict or extrapolate a future correction signal from a series of previous correction signals. If this prediction is based on knowledge of how the level computer works, and thereby of how the power signal possibly varies, e.g. fast or slow, by linear or curved slopes, etc., the prediction can be made quite accurate.

What prediction or extrapolation method to provide by the prediction circuit PC in a particular implementation of the present invention depends on the delays of the ratio circuit of that particular implementation and on the nature of the changes of the tracking power supply voltage, on one hand controlled by the level computer, on the other hand caused by errors in the supply. A preferred prediction circuit PC comprises modeling the correction signal by a polynomial on the basis of a sequence of previous correction signal instances, and predicting future correction signal instances from that model. The polynomial is preferably a second or third order polynomial, established on the basis of the previous 3 or 4 correction signal samples. The delay to be compensated for by the prediction means may typically correspond to 2 to 10 samples of the input utility signal, e.g. 6 samples of a signal with a rate of 384 kHz. When the delay corresponds to e.g. 6 samples, and the prediction means e.g. models the correction signal by a second order polynomial $y(n)$ on the basis of the correction signal samples $x(n-2)$, $x(n-1)$ and $x(n)$, it should output $y(n+6)$ as the next correction signal sample.

Simulations show that using second or third order polynomials for compensating delays corresponding to e.g. 6, 8 and 10 samples of the input utility signal, when the changes of the supply voltage, both level computer controlled and errors, are relatively slow, i.e. with frequency components less than e.g.

10 kHz, increases the effect of providing a correction signal CS that corrects the input utility signal appropriately in the light of delays.

In an alternative embodiment, delays are provided at different places in the circuit to ensure that the correction signal CS corresponds in time with the utility signal, and that the power signal corresponds in time with the utility signal. This may not be appropriate in some applications, e.g. when used for live performance or together with other amplifiers or processing means processing the same or corresponding signals, e.g. a corresponding video feed, in different paths, but it would not be a problem for play back of audio, e.g. in an MP3 player, etc. A delay corresponding to the delay in the level computer and correction signal estimator could preferably be placed at the input utility signal between the tap for the level computer and the multiplication point MP. A delay corresponding to the delay in the supply switching power stage SSW and supply output filter SOF could preferably be placed between the multiplication point MP and the pulse modulator PM.

FIG. 6 illustrates an alternative embodiment of a correction signal estimator CSE. A ratio circuit RC determines the ratio of a power signal reference PSR to the power signal PS, and delivers a ratio signal RS, which can be used as correction signal CS directly, or can be further processed by a prediction circuit PC. This embodiment uses the actually produced power signal PS for establishing the correction signal, and thereby also corrects any errors introduced by the power supply which also cause the power signal to vary. A disadvantage of this is that the power signal PS has to be measured, whereas the embodiment of FIG. 5 can use a preferably digital value from the level computer directly in a digital domain division. The power signal PS is preferably scaled for use in a low-voltage ratio circuit, e.g. by a simple voltage divider based on a couple of resistors or any other means for delivering a voltage-controlled control signal. The power signal reference PSR should correspond to the highest possible value of the power signal, and should be scaled correspondingly. Thus, the ratio circuit RC could be adapted to take operate on power signal reference of e.g. 30V and a power signal of e.g. 24V to create a ratio signal of 30/24=1.25, or it could be adapted to take a power signal reference PSR of 5V and a power signal scaled by ⅙ to 4V, and create a ratio signal of 5/4=1.25. The ratio circuit could also comprise an analog to digital converter configured to establish a value between 0 and 1 from the power signal, where 0 would correspond to 0V and 1 would correspond to 30V. In this case the power supply reference would simply be the value 1, and the division be carried out by conventional signal processor division.

Further alternatives and details mentioned above according to the embodiment of FIG. 5 equally apply to the embodiment of FIG. 6.

FIG. 7 illustrates a preferred embodiment of a correction signal estimator CSE, which combines the advantages of the two above-described embodiments. A first ratio circuit RC1 determines as in the embodiment of FIG. 5 the ratio of a power signal reference PSR to the desired power signal representation DPS, and delivers a first ratio signal RS1. As described above, this ratio is convenient to establish in the digital domain on the basis of a normalized output of the level computer, i.e. the desired power signal representation DPS, and the value 1 and power signal reference PSR. The first ratio signal RS1, however, suffers as described above from not handling any errors introduced to the power signal PS by the constant DC supply ACDC or the supply switching power stage SSW. Therefore a second ratio circuit RC2 determines the ratio of the desired power signal representation DPS or the modulated desired power signal MDPS to the actually delivered power signal PS, i.e. the error introduced subsequent to the level computer's determining the desired voltage, and delivers a second ratio signal RS2. As described above, this ratio required actually measuring the power signal voltage, but on the other hand, it enables correction for not only the variance controlled by the level computer, but also any ripple, buzzing or other amplitude noise subsequently applied to the power signal. The first and second ratio signals RC1, RC2 are multiplied together by multiplication point MP2 and delivered as a correction signal CS, possibly after appropriate prediction by a prediction circuit PC.

By basing the second ratio signal on only the error of the power signal, i.e. the desired voltage divided by the actual voltage, instead of the full change, i.e. the nominal voltage divided by the actual voltage, is further achieved that the resolution of the division is improved and kind of zooms into the error. As the error in voltage is typically very small compared to the decrease in voltage controlled by the level computer, the correction of the error becomes more accurate than when handled together with the full voltage decrease.

In the following is described an example of how the embodiment of FIG. 7 works: If the nominal or maximum supply voltage is 30V, represented by a power signal reference with the value 1, and the desired voltage determined by the level computer is 25V, represented by a desired power signal representation DPS with the value five sixths, or approx. 0.8333, the first ratio circuit RC1 establishes a first ratio signal RS1 of 1/0.8333=1.2. This gives an indication of the necessary correction, but does not include any errors introduced by the power supply. If the actually measured power signal PS is only 24V, i.e. an error of 1V, this may be scaled to 4V as described above to fit in a 5V ratio circuit system, and the desired voltage of course is still 25V represented by the modulated desired power signal MDPS as approximately 4.1667V, the second ratio circuit RC2 establishes a second ratio signal RS2 of 4.1667/4=approx. 1.0416. By multiplying the first and second ratio signals RS1, RS2, correction signal CS is obtained, in this example CS=1.2*1.0416=1.25. In other words, the preferred embodiment of FIG. 7 provides a coarse or large scale level correction ratio signal RS1 and a fine or small scale error correction ratio signal RS2, and by multiplying these values a quite accurate correction signal CS is obtained.

Further alternatives and details mentioned above according to the embodiment of FIG. 5 or 6 equally apply to the embodiment of FIG. 7. It is noted, that alternatively, or in addition to a common prediction circuit PC after the multiplication point MP2, each ratio circuit RC1, RC2 could be provided with a prediction circuit specifically taking care of the delays introduced in each path.

FIG. 8 illustrates an embodiment of a preferred ratio circuit RC for use with analog input signals such as the power signal voltage. The embodiment of FIG. 8 may thus advantageously be used for the ratio circuit RC of FIG. 6 and the second ratio circuit RC2 of FIG. 7. It comprises a voltage scaler VS for scaling the probably relatively high voltage input, e.g. a power signal PS into the amplitude range used in the ratio circuit, e.g. 5V or 3.3V. The voltage scaler VS delivers a power signal representation PSRS, which is still represented by an analog voltage. A pulse modulating ratio circuit PMRC takes a power signal reference PSR, or in the embodiment of FIG. 7, a desired power signal voltage DPS or MDPS, and divides it by the power signal representation voltage PSRS. The result is a pulse modulated ratio signal PMRS, which is down-sampled and thereby also demodulated by a decimation circuit DC, to produce a ratio signal RS representing the ratio of the power signal reference PSR or the modulated desired power signal MDPS by the power signal representation PSRS.

The voltage scaler VS may comprise any kind of power or DC/DC converter, e.g. simply two resistors configured as a voltage divider, preferably followed by a voltage follower ensuring high input impedance and no significant additional load on the supply. The description relating to FIG. 8 of international patent application WO 2005/036735, hereby incorporated by reference, further describes in more detail examples of suitable voltage scalers VS.

The pulse modulating ratio circuit PMRC is now described in more detail: FIG. 9 is provided for describing one of the techniques behind the preferred pulse modulating ratio circuit PMRC embodiment of FIG. 8. FIG. 9 comprises an input signal Vin, a forward path with a forward gain FG, an output signal Vout, and a feedback path from the output signal Vout through a feedback gain BG to a summing point, where the feedback path signal is subtracted from the input signal Vin.

The output signal Vout thus recursively depends on the input signal Vin in the following way:

$$Vout = FG(Vin - BG \cdot Vout)$$

which may be rearranged into:

$$\Leftrightarrow Vout(1 + FG \cdot BG) = FG \cdot Vin$$

$$\Leftrightarrow Vout = \frac{FG}{1 + FG \cdot BG} Vin$$

If the product of FG·BG is much greater than 1, the expression may further be reduced into:

$$\Rightarrow Vout = \left.\frac{Vin}{BG}\right|_{FG \cdot BG \gg 1}$$

From the above expressions are seen that, within certain restrictions, a feedback loop may be used as a divider, where the input signal is divided by the feedback gain BG. This effect is advantageously used by the present invention in order to establish an efficient and accurate ratio circuit for dividing analog values and establishing a representation of the reciprocal of a power signal voltage, multiplied by a desired power signal voltage, or in other words, a desired power signal voltage divided by the power signal voltage.

FIG. 10 illustrates a preferred embodiment of a pulse modulating ratio circuit PMRC of FIG. 8 for use in an amplifier according to an embodiment of the present invention. It comprises a loop, the forward path of which comprises a loop filter LF, a modulator MD and a quantizer QZ, and the feedback path of which comprises a digital-to-analog converter DAC and a buffer BM. The feedback path is subtracted from the input to the forward path by means of a summing point SP. The loop is fed with a power signal reference PSR, or a modulated desired power signal MDPS, i.e. the desired nominator of the ratio. In the case of a fixed power signal reference, the signal is preferably originating from a square wave generator, and in the case of the modulated desired power signal MPDS, the signal can be used directly from the tracking power supply TPS. The output of the circuit corresponds to the above-mentioned pulse modulated correction signal PMCS.

The quantizer QZ is mainly provided in order for the pulse modulated correction signal PMCS to be in the digital domain, and the digital-to-analog converter DAC is thus required in order to establish an analog feedback signal. It is noted that principally the output PMCS may as well be analog, thus allowing the quantizer and converter to be omitted, but in most real applications the subsequent decimation, filtering and prediction processing is at least inexpedient to perform on an analog signal. An analog output of the correction signal estimator CSE may be used when the input utility signal IUS is an analog signal e.g. for use as input to an analog PWM modulator. An advantageous alternative to establishing an analog pulse modulated correction signal PMCS would be to include a digital-to-analog converter subsequent to the prediction circuit PC, in order to convert the correction signal CS into the analog domain.

The modulator MD of FIG. 10 modulates the output of the loop filter LF into a PWM signal. The modulator receives on one input a modulation input signal MIS, and on another input a modulation reference signal MRS. Preferably the modulator comprises a comparator having the modulation reference signal input tied to a DC value, preferably 0 V. When the modulation input signal MIS comprises a high-frequency signal component, e.g. the square wave or pulse modulated reference signal PSR or MDPS, the comparator actually compares the input signal MIS with that high-frequency component. This causes the comparator to establish a PWM signal without need for a sawtooth reference signal as conventional PWM modulators. It is, however, noted that any kind of PWM modulator may be used for modulator MD, including conventional modulators that require sawtooth or triangular reference inputs, or any other kind of means suitable for establishing a PWM signal. Also PWM modulators establishing any kind of PWM variants, e.g. NPWM, LPWM, etc., may be used for modulator MD. When the preferred modulation means is used, i.e. a comparator with 0 V DC on the modulation reference signal MRS, the PWM switch frequency $f_{switch}$, i.e. the frequency of PWM periods, becomes the frequency of the high-frequency component, i.e. the frequency of the reference signal PSR or MDPS.

The reference signal PSR or MDPS serves the purpose of representing a reference level, e.g. corresponding to the nominal or desired power supply voltage, but preferably scaled to match the voltage levels of the pulse modulating ratio circuit PMRC. It furthermore preferably serves to provide a high-frequency component to the modulator MD, thus controlling the PWM modulation. To serve these purposes, the reference signal is in the case of a power signal reference PSR preferably established by means of a square wave generator generating a square wave with a duty cycle of 50%. Such a signal may in itself be considered a constant PWM signal. However, the reference signal PRS or MDPS may be any kind of signal, and may thus be adapted to match different power supplies, output signal requirements, PWM modulation techniques, loop filters, signal coding schemes, etc. As the frequency of the reference signal PSR or MDPS preferably controls the switch frequency $f_{switch}$, as described above, its frequency should at least partly be determined on the basis of knowledge of the frequency of the input utility signal IUS that the correction signal estimator interacts with. In order to establish a suitable correction signal, the PWM switch frequency is preferably chosen to be in the order of 10-100 times, e.g. 32 times, the input utility signal IUS sample rate. When this for example is an audio signal with a sample rate of e.g. 48 kHz, the reference signal frequency, and thereby the switch frequency $f_{switch}$ preferably is in the order of 500 kHz-5 MHz, e.g. 1.536 MHz. The reference signal may preferably have a peak-to-peak voltage corresponding to the voltage used for the digital circuits, e.g. 5 V or 3.3 V DC, whereby the nominator of the ratio established by the pulse modulating ratio circuit PMRC is e.g. 5 or 3.3.

The quantizer QZ is illustrated in FIG. 10 as a latch having an input D and an output Q. It is noted that any kind of sample means or analog-to-digital converter may be used instead, e.g. cascade-coupled latches, comparators, etc. The quantizer QZ preferably takes a clock signal in addition to the input D, in order to control the sample rate, which preferably is in the order of 50-200 times, e.g. 128 times, the PWM switch frequency $f_{switch}$. The quantizer QZ thus samples at a frequency of e.g. 196.6 MHz. The ratio between the switch frequency and the quantizing rate determines the resolution of the output PWM signal, as it preferably is a two-level signal. A ratio of e.g. 128 then allows the PWM edges of the pulse modulated ratio signal PMRS to be established with a precision of $\frac{1}{128}$ PWM period.

The loop filter LF as illustrated in the forward path in FIG. 10 represents the joint linear, time invariant filtering made anywhere in the loop. Thus, if a certain desired loop filter characteristic is practically most advantageously obtained by actually performing the filtering in the feedback path or subsequent to the modulator MD, this is within the scope of the invention as well. The loop filter LF thus represents the equivalence model of all linear, time invariant filtering performed, in order to lighten the description and make the circuit easier to simulate.

An example of a preferred loop filter for a stable loop design comprises simple zeroes at 10 kHz, 47 kHz and 1.8 MHz, simple poles at 1 kHz and 180 kHz, and a complex pole at 17 kHz with a Q of 2. The frequency response of such a loop filter HLF(s) is shown in FIG. 11. As seen, the phase margin never gets below 30 degrees, thus ensuring stability. It is noted that ratio circuits suitable for use with the present invention are not restricted to the mentioned preferred loop filter characteristic, and any kind of loop filter is within the scope of the present invention.

Because of the non-linear PWM modulation, the loop filter LF does not describe the total filtering applied. FIG. 11 thus further comprises a frequency response G(s) that better describes the actual response of the loop. When it comes to small signals, the modulator MD may be described as a gain element. This is seen from FIG. 11, where G(s) is equal to HLF(s) except from a gain difference of approximately 40 dB in this example.

A major objective of the loop filter is to reject quantization noise established by the relatively low-resolution quantizer QZ. As the loop filter equivalence model is positioned first in the feedback path, noise injected subsequently to the feedback path, e.g. by the comparator and especially by the quantizer QZ, is rejected by the loop filter characteristic proposed.

Seen from the noise injection point, i.e. the quantizer QZ, the actual loop characteristic G(s) causes a frequency response of:

$$\frac{1}{G(s)+1}$$

This response is also shown in FIG. 11, where it is seen that it rejects noise within a particular frequency band and let high-frequency noise through. This noise shaping is utilized at subsequent stages, i.e. within the decimation circuit DC, as the anti-aliasing performed there is able to cut away the high-frequency noise, but has to let low-frequency content through. Thereby an advantageous method of rejecting noise, in particular quantization errors, is obtained.

The loop filter LF may as well facilitate self-oscillating PWM modulation. By designing the loop filter in such a way that the loop causes a phase shift of −180° at a certain frequency, the loop may attain a state of controlled self-oscillation at that frequency, i.e. the switch frequency. Examples of such self-oscillating modulators are described in the international patent applications WO 00/42702, WO 02/25357, WO 02/093973, U.S. Pat. No. 6,118,336, WO 98/19391, WO 00/27028, WO 2005/002050, WO 2005/029707, WO 2005/029708 and in the U.S. Pat. No. 6,249,182, all hereby incorporated by reference with respect to different basic principles and possible embodiments regarding the establishment and controlling of the desired oscillation in combination with the desired modulation.

Detailed descriptions of different advantageous loop filters and configurations directly suitable for use in a pulse modulating ratio circuit PMRC are further described in the international patent application WO 2005/036735, hereby incorporated by reference, in particular with regard to the description relating to FIGS. 9-13B and 16A-16B of that patent application.

It is noted that even though the modulation is self-oscillating, the switch frequency will be more or less locked due to the reference signal PSR or MDPS, as long as this is a periodically oscillating signal. Whereas the locking effect of the reference signal is most often preferred and sought for in self-oscillating loops, the relatively high amplitude of the above-mentioned preferred type of reference signal, i.e. a square-wave signal with a duty-cycle of 50%, may however cause some degree of disturbance to the loop.

Hence, when the loop filter is designed for self-oscillation, the reference signal may preferably be a DC-value with a small oscillating overlay signal for controlling the oscillation frequency. The amplitude of the oscillating overlay signal may be, e.g., 5% of the reference signal amplitude. The locking signal, i.e. the oscillating signal, does not have to be applied to the reference signal itself, but may be applied anywhere else in the circuit, preferably in the amplitude-continuous domain. When the reference signal is a fixed power supply reference PSR representing the maximum or nominal power supply voltage, it is substantially insignificant if the signal is established as a DC value or a square wave signal. When the reference signal is a modulated desired power signal voltage MDPS, e.g. as illustrated in FIG. 7, i.e. a PWM encoding of a desired voltage, a DC value reference signal can be obtained by demodulating the modulated desired power signal voltage MDPS by means of a low-pass filter. The demodulation should preferably preserve a small oscillating residue to control the self-oscillation as described above.

The oscillation of the reference signal PSR or MDPS, e.g. the oscillating overlay signal, should preferably be synchronized with the clock and/or rate used for the pulse generator of the audio amplifier. Preferably the reference signal PSR or MDPS is synchronized with the input utility signal, an upsampled representation of the input utility signal or the switch frequency of a possible PWM power stage. One advantageous way to achieve such synchronization is to use a representation of one of the clock signals used elsewhere in the amplifier as reference signal or oscillating overlay signal.

Further methods of controlling the switch frequency in a self-oscillating PWM modulation loop are disclosed and discussed in international patent applications WO 2005/029707 and WO 2005/029708, hereby incorporated by reference.

The buffer BM scales the feedback signal according to a power supply representation PSRS, i.e. a representation of the actually supplied voltage, and the desired denominator of the ratio established by the ratio circuit in the embodiments of FIG. 6-8. The buffer may comprise any kind of amplifier, filter, multiplication and/or divider means, etc. that is able to suit the purpose of modifying the feedback signal into a signal that represents the actual power supply voltage PS. In other words, the buffer BM works as a switching stage that establishes a voltage corresponding to the power signal representation PSRS, whenever its input is active, i.e. the buffer scales the amplitude of the PWM signal in the loop, but not the widths. Thereby the buffer output corresponds to the power supply reference PSR or modulated desired power signal MDPS, but now suffering from the same amplitude error as the actually established power signal PS.

In a preferred embodiment the buffer BM further comprises specifications that correspond directly or as a representation, to the specifications of the switching power stage SWP, and only differs significantly due to scaling, whereby also the possibly somewhat erroneous application of the power signal PS to the pulse modulated utility signal PMS, will be at least partly corrected by the correction signal CS.

The power signal representation PSRS is preferably a downscaled representation of the actual power signal PS provided by the tracking power supply TPS. Alternatively the power signal representation PSRS is a pre-scaled signal, a modulated or converted signal, etc., representing the power signal PS. The scaling of the power signal representation should ensure that the ratio between the nominal or desired power signal voltage, respectively, and the actual power signal voltage is mirrored by the ratio between the reference signal PSR or MDPS and the power signal representation PSRS. For example, for the embodiment of FIG. 6 establishing the ratio of the nominal or maximum power signal by the actual power signal, when the nominal supply voltage is e.g. 30V and the power signal reference PSR is e.g. 5V, i.e. 5/30 or one sixth of the nominal voltage it represents, the scaling of the power signal into a power signal representation should reflect this, and also perform or scaling of one sixth, so that if the voltage established by the tracking power supply as controlled by the level computer is e.g. 24V, the power signal representation PSRS should be 24V/6=4V. Thereby the ratio nominal voltage by actual voltage, e.g. 30V/24V, equals the ratio power signal reference PSR by power signal representation PSRS, e.g. 5V/4V. Another example, for the embodiment of FIG. 7, where the desired supply voltage determined by the level computer is e.g. 24V and the modulated desired power signal MDPS is e.g. 4V, i.e. 4/24 or one sixth of the desired voltage it represents, the scaling of the power signal into a power signal representation should reflect this, and also perform or scaling of one sixth, so that the if the voltage including errors established by the tracking power supply is actually only e.g. 21V, the power signal representation PSRS should be 21V/6=3.5V. Thereby the ratio desired voltage by actual voltage, e.g. 24V/21V, equals the ratio modulated desired power signal MDPS by power signal representation PSRS, e.g. 4V/3.5V.

As described with reference to FIG. 9, multiplications performed on the feedback signal are experienced from the output of the loop as divisions of the input signal. Thus, scaling the feedback signal according to the actual power signal PS or a representative thereof, causes the output signal PMRS to be divided by the actual power signal PS, or the representative thereof. Thus an advantageous method of obtaining the reciprocal of an erroneous signal, in order to be able to compensate for it, is obtained.

The above-illustrated pulse modulating ratio circuit may basically be designed according to the principles of the international patent application WO 2005/029707 "Self-oscillating A/D-converter", hereby included by reference in the sense that a voltage depending amplification is added in the feedback loop of the converter and that the A/D-converter is fed by a reference signal, preferably a square wave level generator, to which the feedback signal may be compared by subtraction. The resulting output of the inverting circuit will then be a digital inverse representation of the analog variation of the power supply.

Thus, according to an embodiment of the invention, the actual supply voltage established by the tracking power supply may be compared to a nominal supply voltage and an inverse digital representation of the difference may be directly output in a digital form suitable for correction of the input utility signal accordingly, prior to a non-linear modulation of the signal. Or in another embodiment, the actual supply voltage established by the tracking power supply may be compared to a desired supply voltage determined by the level computer and an inverse digital representation of the error may be directly output in a digital form suitable for correction of the input utility signal accordingly, prior to a non-linear modulation of the signal.

The description relating to FIG. 7 of international patent application WO 2005/036735, hereby incorporated by reference, further describes in more detail how the pulse modulating ratio signal may be established.

The digital-to-analog converter DAC of FIG. 10 may be any suitable kind of means for converting a digital PWM signal into an analog PWM signal. The DAC may also be integrated in the buffer BM, either explicitly, or implicitly if the implementation allows for a signal from the digital domain to be used in the analog domain without conversion.

The decimation circuit DC of FIG. 8 may be any kind of circuitry suitable for adapting the pulse modulated ratio signal PMRS into a correction signal CS suitable for application to the input utility signal IUS. The adaptation may e.g. comprise demodulation, rate conversion or decimation, conversion of encoding, amplitude scaling, biasing, or any other signal adaptation processes. An example of a suitable decimation circuit is a downsampler.

Preferred methods of implementing the decimation circuit DC, as well as several embodiments, are disclosed in the international patent application WO 2005/086346, hereby incorporated by reference.

As the pulse modulated ratio circuit PMRC output PMRS preferably is a two-level PWM signal sampled at a rate of e.g. 196.6 MHz, and the input utility signal IUS preferably is an audio signal having a resolution of e.g. 24 bits and a sample rate of e.g. 48 kHz, a preferred decimation circuit DC may comprise an anti-aliasing filter of the finite impulse response type (a FIR filter), combined with logics for decimating the number of output samples. An example of such is a low-pass filter operating on a relatively high rate, preferably the sample rate of the pulse modulated ratio signal PMRS, e.g. 196.6 MHz, followed by a sample-skip logics which, e.g., skips all but one sample every 128 samples, thereby causing the rate of the decimator circuit output signal to be, e.g., 1.536 MHz. The FIR filter, which preferably is a low-pass filter, serves at least three purposes. It serves as anti-aliasing means, as anti-aliasing should always be performed before any sampling, and decimation may in this connection be considered a sampling process. It also rejects noise, e.g. quantization noise originating from the quantizer QZ within the pulse modulated ratio circuit PMRC, at frequencies close to multiples of the output sample rate that is not rejected by the loop filter LF. And furthermore, it inherently provides for demodulation of the pulse width modulated ratio signal PMRS, as low-pass filtering has this effect on PWM signals. The FIR filter may preferably be established as three cascaded running average filters, preferably followed by two half-band FIR filters. Thus the decimation may be performed in three steps. The implementation of the first FIR filter comprising three cascaded running average filters causes decimation of the PMRS signal of e.g. 128 times from e.g. 196.6 MHz to e.g. 1.536 MHz, the first half-band FIR filter causes decimation of e.g. 2 times down to e.g. 768 kHz, and the second half-band FIR filter causes decimation of e.g. 2 times down to e.g. 384 kHz. This furthermore requires the input utility signal IUS to be upsampled e.g. 8 times from e.g. 48 kHz to the 384 kHz rate. This, however, in many switching amplifiers preferably forms part of the PWM modulation anyhow performed on the input utility signal IUS.

The decimation circuit DC preferably comprises an anti-aliasing filter having an impulse response which is longer than the period of the pulse width modulated signal, preferably at least the length of two times the period of the pulse width modulated signal, and even more preferably at least the length of three times the period of the pulse width modulated signal. If the pulse modulated ratio signal PMRS is sampled at a rate of, e.g., 196.6 MHz, and the PWM switch frequency, i.e. the frequency of the PWM periods, is, e.g., 1.536 MHz, then the number of samples for each PWM period is 128, and the impulse response of the anti-aliasing filter of the decimation circuit should then be at least 128 samples, preferably at least 384 samples.

FIG. 12-16 illustrate different principle results of using five different algorithms in the level computer LC of the tracking power supply TPS. Due to clarity are only shown a single input utility signal, i.e. one channel. In a multi-channel amplifier, the level computer may e.g. track each channel according to e.g. the examples below, and use the highest resulting value for the power supply, or it may e.g. first derive a maximum signal as the at any time maximum value of the input utility signals and track that maximum signal. It is noted, however, that the present invention is not restricted to any particular tracking power supply technology or algorithm, and the illustrated examples are merely provided for the purpose of information. The correction signal estimator CSE of the present invention is able to handle any kind of varying supply voltage caused by any kind of tracking power supply technology.

Figure 12:
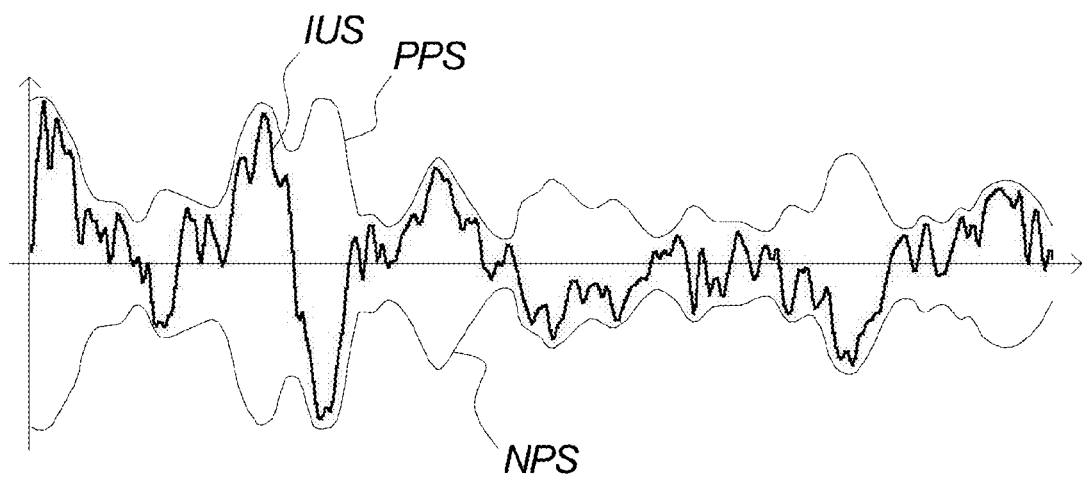

FIG. 12 illustrates an example of an input utility signal IUS as a function of time. In one embodiment of a tracking power supply the level computer LC may track the input utility signal rather closely, and determine a positive power signal PPS and negative power signal NPS constantly varying with the utility signal. Due to typical tracking power supplies establishing positive and negative power signal components symmetrically, the level computer actually tracks the absolute value of the utility signal, and the negative power component amplitude will thus increase even with increasing positive utility signal values, and the positive power component will increase even when the utility signal is negative, with negative slope. It is noted, that even when the input utility signal IUS and the power signal PPS, NPS is illustrated with comparable dynamic range, this is just for clarity. The digital resolution or analog range may very well be different.

Figure 13:
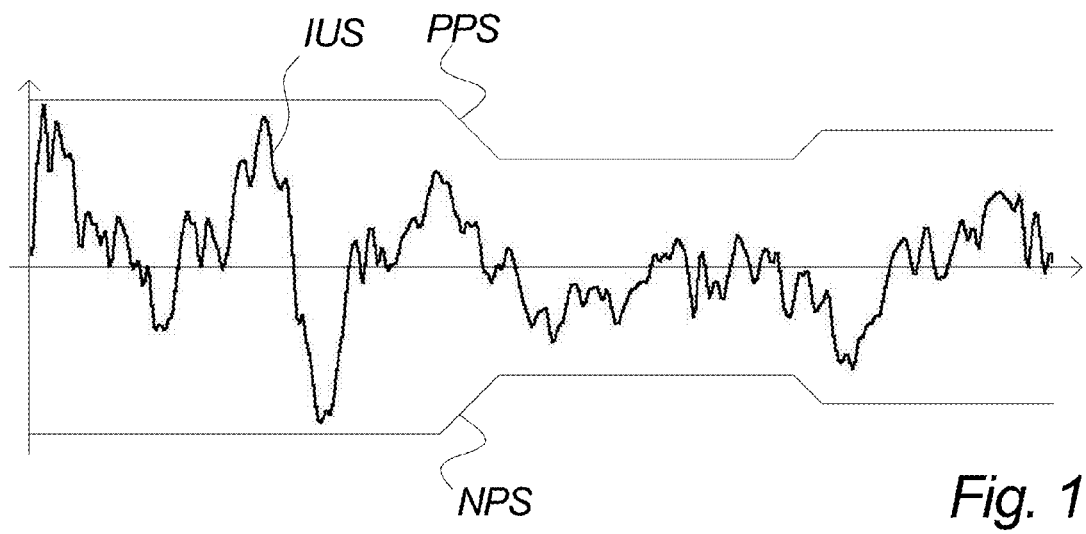
Figure 14:
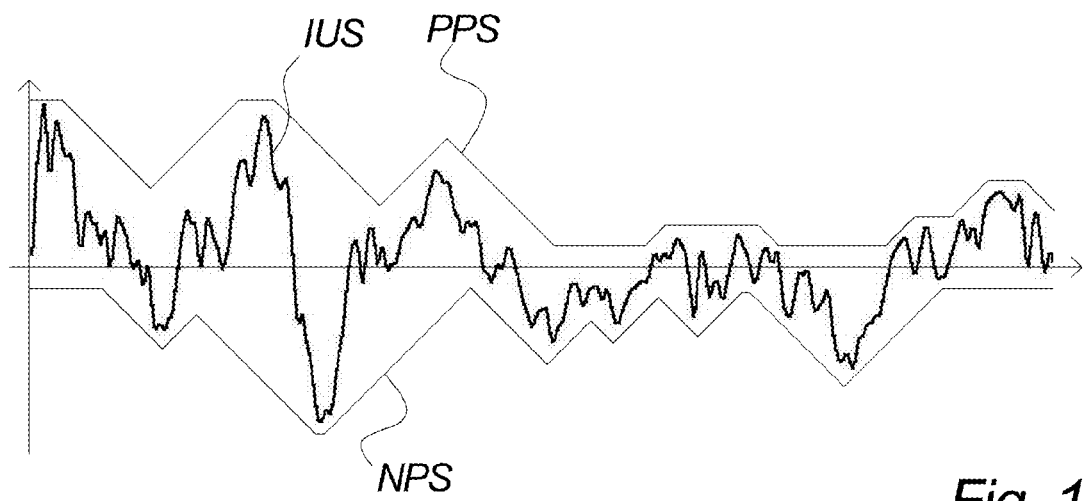

FIG. 13 illustrates the same input utility signal IUS as a function of time. In this embodiment of a tracking power supply the level computer LC tracks the input utility signal rather loosely, and aims at choosing positive and negative supply voltages PPS, NPS that can remain constant for a while. This embodiment requires less from the correction signal estimator, and from the tracking power supply itself, but on the other hand it obviously does not achieve the same degree of reduced power dissipation and EMI.

FIG. 14 again illustrates the same input utility signal IUS as a function of time. In this embodiment the tracking power supply enables separate control of the positive and negative supply, and thereby allows for bi-polar tracking of the utility signal and even less waste than illustrated in FIG. 12.

FIG. 15 illustrates the absolute of a different input utility signal IUS as a function of time t. The power signal PS or actually the desired power signal is determined by an algorithm that incorporates a lower threshold for the power signal, in this example 10% of maximum or nominal voltage, due to the switching power stage not being able to operate below a certain supply voltage, regardless of the utility signal. When above the threshold, a tracking algorithm particularly advantageous because of its constant and frequency independent delay, is applied. The tracking algorithm comprises first finding the maximum value among absolute values of a certain amount of consecutive samples of the utility signal, i.e. a time window, and secondly averaging a certain number of the found maximum values, e.g. by a running average FIR filter. In FIG. 15 is shown the resulting power signal PS, which quite closely tracks the utility signal, except when below the threshold of 0.1.

FIG. 16 corresponds to FIG. 15, except for the tracking algorithm being of an asynchronous attack/decay type with fast response to increasing maxima, but a slowly decaying response to decreasing maxima.

In a preferred embodiment of a tracking algorithm, the frequency of the desired power signal representation DPS signal delivered by the level computer LC, i.e. the frequency determining the shortest possible time a certain supply voltage can be delivered, should preferably be selected with due consideration of the bandwidth of the switching power supply in order to not be distorted, and thereby cause a distorted power signal. This is in particular important for embodiments where the correction signal estimator CSE does not regard the actually delivered power signal, but only considers the desired power signal, as in the embodiment of FIG. 5. In a preferred embodiment, the frequency or sample rate of the desired power signal representation DPS signal is $\frac{1}{10}$ of the tracking power supply TPS switch frequency.

In a preferred embodiment where the correction signal estimator delivers a control signal with an information rate of less than approximately 10 kHz as this is shown to result in the best compensation when considering delays etc., as mentioned above, it is even more important that the power supply signal does not change faster than e.g. $\frac{1}{10}$ of this, and should thus have a control frequency of approximately 1 kHz or less. On the other hand, the frequency should not be too low, as slower control requires longer look-ahead delay, which e.g. adds to the uncertainty of the prediction and generally the correction of the utility signal.

In general the level computer in a preferred embodiment should therefore comprise a lower threshold in order to not shut off the switching power stage completely, and a bandwidth limiter or simply a relatively low information frequency, i.e. the frequency of the desired power signal representation DPS, in order to enable undistorted power signal generation and precise correction of the utility signal.

Among other things, due to the correction signal estimator CSE preferably not delivering correction factors faster than e.g. at a rate of 10 kHz, any power signal errors or variations that have higher frequency components are not corrected. This for example involves ripple deriving from the switch frequency of a switch mode power supply and harmonics thereof, and which may not be filtered away by the supply output filter SOF. Such ripple is multiplied with the utility signal in the switching power stage(s) SWP of the amplifier(s), and thereby causes errors in the output audio. In particular the possible difference frequencies between the ripple and the pulse modulated utility signal can result in errors within the audio frequency range. For example, the clock for pulse modulating the desired power signal representation e.g. in order to spare different clock generators or dividers, could easily be implemented with the same clock as used for pulse modulating the utility signal(s) in the amplifiers, e.g. 384 kHz, i.e. 8 times an audio sample rate of 48 kHz. But simulations show that ripple at the switch frequency, e.g. 384 kHz, and harmonics, when applied to a utility signal e.g. comprising a 6 kHz sine wave, and modulated at 384 kHz into a double-sided 2-level PWM thereby having some frequency components at 384 kHz+/−12 kHz, results in an amplified output signal with significant error components at e.g. 12 kHz, and small components at 6 kHz and 24 kHz, i.e. within the audio band. In one embodiment of the invention, the filters in the tracking power supply are improved to better filter out this specific ripple component, e.g. by implementing higher order filters. In an alternative embodiment of the invention the switch frequency of the tracking power supply should not equal the switch frequency of the utility signal amplifier(s). One way to obtain this is to maintain the switch frequency of the power supply in synchrony with the amplifier switch frequency, but at a different multiple of the audio sample rate, e.g. 7 times 48 kHz, i.e. 336 kHz, instead of 384 kHz. With the same utility signal as in the example above, this causes the difference frequency error components in the resulting amplified utility signals to be positioned with a significant component at 48 kHz, and smaller components at 36 kHz and 60 kHz, i.e. outside the audio band.

FIG. 17 illustrates examples of signals in a switching amplifier according to an embodiment of the invention. The signals are depicted in the time-domain, i.e. with time in seconds at the horizontal axis, and amplitude at the vertical axis. It is noted, that all signals have been normalized, so the typically different gains of input signals, power signals and amplified utility signals do not appear, and are also somewhat irrelevant in this regard, as they could as well be unity. The scenario is a 2-channel switching amplifier according to the present invention, e.g. as illustrated in FIG. 4, i.e. comprising one tracking power supply, one correction signal estimator, but two utility signal amplification paths.

X1 and X2 is the input utility signals IUS1, IUS2, in the two channels. In order to make the features of the invention appear clearer, the utility signals are quite different and uncorrelated, which they will rarely be in practice.

E1 and E2 are envelopes of X1 and X2, respectively, i.e. a smoothed tracking of peak absolute values of the two utility signals, as could be established within an embodiment of a level computer LC. The tracking has furthermore been subject to a low threshold or minimum amplitude of 0.25 in order to ensure a certain minimum power signal voltage to drive the switches of the amplifiers, as described in more detail above. The low threshold causes the completely flat envelopes at times where the input utility signals X1 and X2 are very small, but not necessarily silent.

P illustrates the output of the level computer LC, i.e. the desired power signal DPS. It is an envelope of the envelopes, so to speak In the present example it is just the peak value among each corresponding two envelope values derived from the two channels, but of course the level computer LC can establish the combined envelope and desired power signal in any suitable way, including first combining the utility signals, and thereafter do the envelope determination. Assuming a near-perfect switch mode power supply, the normalized, actual power signal PS will equal the signal illustrated by P.

C illustrates the output of the correction signal estimator CSE, i.e. the correction signal CS. As all the signals in the example are normalized, C is simply 1/P, assuming the reference maximum supply level is 1. That C is the reciprocal of P is easily seen from the illustration.

C1 and C2 illustrate the input utility signals X1 and X2 after the processing according the correction signal, i.e. after the correction signal C has been multiplied individually to the utility signals X1 and X2. As seen, the application of C causes the utility signals to scale in an inverse relationship with the power signal P. An interesting and advantageous feature is that the utility signals are scaled to where the largest of them fills the full dynamic range, except from where the principle is limited by the low threshold, as seen e.g. around 0.1 sec. and 0.3 sec. where the power signal is stationary at the low threshold level. At the rest of the time, from approximately 0.38 sec. first C1, then C2, and finally again C1 utilize the full dynamic range. This improves the signal-to-noise ratio and decreases the effect of errors introduced in the modulation and switching power stages.

A1 and A2 are the amplified utility signals AUS1, AUS2, i.e. they are derived by multiplying the power signal P with C1 and C2, respectively. A1 and A2 equals X1 and X2, respectively, and thereby illustrate the principle, that multiplying the input utility signals with a constant value, which takes place in conventional switching amplifiers, can be substituted with correcting the input utility signals and then multiplying them with a value varying in accordance with the uncorrected utility signals, which takes place in switching amplifiers according to the present invention.

FIG. 18 illustrates an alternative to the embodiment of the present invention illustrated in FIG. 1 in that it illustrates an embodiment of the present invention where some degree of feedback error suppression is applied in the output stage, and how a tracking power supply and a correction signal estimator can be implemented in such amplifiers. FIG. 18 illustrates an input utility signal IUS being pulse modulated by a pulse modulator PM to establish a pulse modulated signal PMS. This signal is amplified by a switching power stage SWP to form an amplified utility signal AUS, which may be delivered to an output filter OF for deformation and a loudspeaker LS for reproduction. The pulse modulator PM in the present embodiment comprises a quantizer and noise shaper QN and a pulse generator PG. Around the quantizer, noise shaper, pulse generator and switching power stage is established a feedback loop to suppress errors introduced in these stages. A further loop may include the output filter, as indicated by the dashed line. According to this embodiment of the present invention for using a tracking power supply TPS with a switched amplifier with feedback, a correction signal estimator CSE is applied to establish a correction signal CS on the basis of a supply information signal SIS, as described according to any of the above. The correction signal CS should be applied to the input utility signal inside the feedback loops in order to avoid having the correction signal estimator CSE and the feedback error suppression fight each other. The pulse generation and feedback loop(s) may be stable, or facilitate self-oscillating, and may comprise any necessary or suitable filtering, processing, etc. When using a tracking power supply and correction signal estimator together with feedback amplifiers, the delay or look-ahead, e.g. applied in the prediction circuit PC in the correction signal estimator should be changed accordingly.

FIG. 19 illustrates another embodiment of a switching amplifier according to the present invention. It comprises the standard components of a pulse modulated amplifier, i.e. a pulse modulator PM, a switching power stage SWP driven by a power signal PS and typically also an output filter OF and a load, e.g. a loudspeaker LS. These components may comprise any suitable elements and configurations, e.g. as described with reference to any of the above-described embodiments. The embodiment of FIG. 19 further comprises a dynamics optimizer DO that receives the input utility signal IUS and establishes an optimized utility signal OUS, which is delivered to the pulse modulator PM or possibly any standard pre-processing blocks preceding the pulse modulator PM. The dynamics optimizer DO further establishes a gain factor GF delivered to a correction signal estimator CSE which delivers a correction signal CS to a variable power supply VPS. The variable power supply VPS delivers a power signal PS for driving the switching power stage SWP.

In general, the present embodiment differs from the above-described embodiments comprising tracking power supplies in that it controls the input utility signal and provides correction means for making consequential correction to the power signal, whereas the above-described embodiments controls the power signal and provides correction means for making consequential correction to the input utility signal. The prioritized aim in the tracking power supply embodiments is optimization of power consumption, and better dynamics are one of the spin-offs, as described in more detail above. The prioritized aim in the embodiment of FIG. 19 is optimization of dynamics, and reduced power consumption is a spin-off. It may seem that the overall outcome is the same, and it could be in some implementations, but according to the different embodiments, the fine-tuning and implementations may be also different.

The purpose of the dynamics optimizer DO is to scale the input utility signal IUS to utilize the dynamic range available. The advantages by doing so are improved signal-to-noise ratio and signals that are less susceptible to amplifier errors, e.g. non-linear errors applied to small signal values. Evidently, the benefit is greater the smaller the input signal is, as a full-scale signal already utilizes the full dynamic range, and benefits from the associated advantages. The present embodiment therefore improves audio quality of small signals, e.g. music at low volume setting or a quiet piece of music, which is also where any noise or error is most hearable and distracting. In a preferred embodiment the dynamics optimizer DO comprises a level tracker or other level determination means which evaluates how much the present input utility signal can be scaled to still fit in the available dynamic range, i.e. without clipping. The dynamics optimizer DO further comprises a simple multiplicative gain which scales the input utility signal according to the result from the level tracker. Any suitable algorithm for tracking the input utility signal and determine a suitable gain factor is within the scope of the present invention. The tracking can be a sample-to-sample tracking, or based on longer or shorter window averaging. The tracking can also correspond to any of the tracking algorithms described above with reference to a tracking power supply.

In order to not have the switching power stage SWP establish an amplified utility signals AUS which apart from a gain corresponds substantially to the optimized utility signals IUS, the power signal PS multiplied with the pulse modulated signals PMS in the switching power stage, the power signal PS has to be scaled inverse proportionally with the gain factor applied by the dynamics optimizer. For example, if the dynamics optimizer DO doubles the input utility signal level, the power signal has to be halved in order for the switching power stage to output the expected and desired amplified utility signal. To achieve this, the dynamics optimizer DO provides the correction signal estimator CSE with the gain factor GF used to optimize the input utility signal to the dynamic range available. The correction signal estimator then inverses this gain factor to determine the ratio at which the power signal PS should be limited to achieve the correction necessary. This correction signal CS is used to control a variable power supply VPS. For example, if the dynamics optimizer determines that the input utility signal should be doubled to achieve the aim of optimal dynamics, the gain factor GF is 2. The correction signal estimator CSE determines the reciprocal of this, i.e. 0.5, and forwards this as a correction signal CS to the variable power supply. If the nominal power supply voltage is for example 30V, the variable power supply will in the present example establish a power signal PS with only 0.5.30V=15V. As 2.0.5=1, the resulting amplified utility signal AUS will be the same as with no dynamics optimizer and a fixed power signal. The correction signal estimator CSE may comprise any means for establishing the reciprocal or inverse representation of the gain factor, e.g. any of the embodiments described above with reference to any of the FIGS. 5 to 10. In an alternative embodiment of the present invention, the correction signal estimator may establish an absolute voltage level instead of a ratio, e.g. 15 instead of 0.5 for a 30V nominal power supply. The variable power supply is preferably of a switching power supply type, but may comprise any power supply technology facilitating control of the output voltage and/or current. Any of the power supply technologies mentioned in any of the above regarding tracking power supplies can be used for variable power supply according to the present embodiment. The dynamics optimizer could also be configured to select one of a few pre-determined gain factors, e.g. 1.5, 2.0, 4.0, etc., in order to facilitate non-stepless variable power supplies, e.g. variable power supplies with only e.g. 2 or 3 corresponding power rails to choose from. It is further noted, that the correction signal estimator CSE may be an integral part of the dynamics optimizer DO, or of the variable power supply VPS. Moreover, instead of receiving a gain factor or other information from the dynamics optimizer, the correction signal estimator may within the scope of the present invention, compare or receive the result of a comparison of the input utility signal IUS and the optimized utility signals OUS.

It is noted that the dynamics optimizer not necessarily scales the input utility signal to the maximum available range. Other optimization schemes may be applied in order to achieve other goals, or in order to avoid other error possibilities or non-linearities in the subsequent stages. For example, if full-scale signals are a problem in a certain amplifier configuration, the dynamics optimizer could down-scale a full-scale input utility signal, and the correction signal up-scale the power signal instead. For example, if a certain signal level is a problem in a certain amplifier configuration, e.g. due to a non-linearity, the dynamics optimizer could up- or down-scale the utility signal to avoid to the extent possible such values, and the correction signal estimator could do the consequential correction necessary of the power signal. For example, if substantially unchanged utility signal level for a long time is a problem in a certain amplifier configuration, e.g. a certain method of pulse modulation causing a distinct noise to build up if the input is steady, the dynamics optimizer could vary the utility signal level, and the correction signal estimator could vary the power signal inversely. As the present invention utilizes multiplicative correction and gain, the dynamics optimizer is preferably not configured to change an input utility signal of zero, as this would not be correctable by the correction signal estimator by means of a correction factor. But the correction signal estimator can in an embodiment of the present invention set the power signal PS to zero, whereby the switching amplifier ceases to work, and the output becomes zero, regardless of the output of the dynamics optimizer and the pulse modulator.

It is noted that the embodiment of FIG. 19 of the present invention can be used in a multi-channel amplifier as well, within the scope of the present invention. In that case, individual variable power supplies could be used for each channel. In a preferred embodiment, however, the dynamics optimizers for the multiple channels communicate with each other and agree on the highest gain factor acceptable for all channels. This common gain factor is then used in all channel's dynamics optimizers and in a common correction signal estimator and a common variable power supply. In an alternative embodiment a common dynamics optimizer receives all input utility signals, determines the highest acceptable common gain factor, and outputs this gain factor to multiplication points in each channel to multiply with each input utility signal. The common gain factor is also provided to a common correction signal estimator and variable power supply.

FIG. 20 illustrates an alternative for the embodiment of FIG. 19. In addition to the elements described above, it comprises feedback from the switching power stage output to the input, and optionally also from the output filter output to the input. These feedback paths work and achieve substantially according to the description above regarding the embodiment of FIG. 18. Each feedback path comprises a filter F1, F2, preferably linear time-invariant filters. They are fed back to a controller block CB which comprises summing or subtraction points for applying the feedback to the forward path, and possibly also filters. In a preferred embodiment is further provided a look-ahead block LAB in the forward path, prior to the controller block CB, and outside the feedback loop. The look-ahead block LAB may simply comprise a delay and means for forwarding a signal value or determined peak-value or other signal tracking value as a look-ahead signal LAS to the dynamics optimizer DO.

Thereby the dynamics optimizer, and in turn the correction signal estimator, and eventually the variable power supply are able to regulate or correct the voltage before a propagating signal peak reaches the loop input. This is in particular significant when the signal is relatively low valued, and suddenly changes to a large scale signal. In an alternative embodiment, a delay is added inside the loop, thereby, however, decreasing the possible loop-gain and thereby the noise suppression. In an alternative embodiment the implementation is analog, possibly except for the delay.

FIG. 21 illustrates a preferred embodiment of the present invention. The embodiment is illustrated as a two-channel system, but the characteristics of this embodiment may as well be applied to a multichannel system e.g. as illustrated in FIG. 4 or a single channel system e.g. as illustrated in FIG. 1. As the embodiment of FIG. 21 is close to the embodiment of FIG. 4, it will be described in terms of the differences between FIG. 4 and FIG. 21. In the present embodiment, the output stages of the two channels comprises power amplifiers with feedback PAFB1, PAFB2, instead of open loop switching power stages SWP1, SWP2, etc. The power amplifiers with feedback are also switching output stages, e.g. simply comprising an integrator, a comparator and a power stage, and having a feedback from the output of the power stage back to the input of the integrator, as is e.g. known from U.S. Pat. No. 4,249,136, hereby incorporated by reference with regard to embodiments of switching power stages with feedback. It is noted, that the present invention also applies to any other switching power stage with feedback.

By using a power amplifier with feedback PAFB1, PAFB2, instead of an open loop power stage, the effect of reducing the supply voltage, i.e. the power signal PS, is, however, lost, because the feedback will effectively counteract the reduced supply voltage by simply increasing the gain. Hence, a power amplifier with feedback typically causes a fixed gain, e.g. of 10 times. In order to be able to use the present invention together with such feedback power stages, the pulse modulated signal to be amplified must be compensated further and this time by scaling it in relation to the voltage of the power signal PS.

Therefore is provided in the present embodiment a buffer BUF1, BUF2 in each channel prior to the power amplifier feedback stages PAFB1, PAFB2. The buffers are components that simply scale their input signal according to their supply voltage DS. Because of the gain in the power amplifier with feedback, e.g. 10 times, the pulse modulated signal should however not be scaled according to the power signal PS directly, e.g. 3 to 30 V, but rather according to a representation thereof, which has been divided by means of a voltage divider VDIV by the same value as the gain, e.g. 10 times, causing a divided supply DS range e.g. from 0.3 to 3 V according to the above examples.

Even though the embodiment of FIG. 21 seems a bit awkward because of the tracking supply and related compensation necessitating a further, opposite compensation, it actually provides a significant advantage: It allows the tracking power supply TPS to reduce the voltage of the power signal PS far more than what is typically possible with an open loop switching output stage SWP. Hence, if the possibility of very low supply voltage, and thereby power consumption, is desired, the embodiment of FIG. 21 becomes relevant.

In relation to the embodiment of FIG. 21, it is emphasised that all alternatives, features, advantages, etc., of the previous embodiments also apply to the present embodiment so far that they are compatible with the power amplifiers with feedback and the related, necessary scaling of the pulse modulated signal. In particular this means that e.g. the further advantages obtained by using the present invention in multichannel amplifier systems with shared power supply described with reference to FIG. 4 also apply to the embodiment of FIG. 21, as well as the various embodiments of a tracking power supply.

FIG. 22 illustrates an implementation of an embodiment of the present invention. The embodiment being implemented resembles that described above with reference to FIG. 4 most, but it is noted, that the principles of any of the embodiments may be combined with the implementation principles described in relation to FIG. 22. The main purpose of FIG. 22 is to illustrate what kinds of hardware could preferably be used to implement the different components of the system.

It comprises a two-channel amplifier, i.e. a stereo amplifier. The physical implementation comprises a digital signal processor DSP or other processing device, e.g. microprocessors, computers, etc., capable of executing software and processing digital data with no specific requirements to physical representation, levels, etc. The DSP handles the first part of both the utility signal processing and the power supply processing, e.g. the level computer LC, parts of the supply pulse modulator SPM, the correction signal estimator CSE and parts of the pulse modulators PM. Regarding the supply pulse modulator SPM and the pulse modulators PM, the DSP is typically well-suited to perform the modulation, apply quantization and noise shaping, etc., but is typically not able to establish analog electrical pulses corresponding to the calculated pulses. Hence, this part is preferably handled by a programmable gate array PGA, e.g. an FPGA, or any similar hardware device capable of establishing electrical pulses from the data output by the DSP. The switching power stages SWP, the output filters OF, as well as the supply switching power stage SSW and supply output filter SOF, should preferably be implemented by separate power hardware as these components often have special requirements regarding e.g. space, power supply, grounding, cooling, etc.

FIG. 23 illustrates an embodiment of a level computer LC, i.e. the steps performed by the level computer LC when determining a desired power signal voltage DPS from e.g. two input utility signals IUS1, IUS2, i.e. representing a stereo signal.

FIG. 24 illustrates an embodiment of a tracking power supply suitable for use with the present invention. This embodiment comprises a feedback around both the supply switching power stage and the supply output filter. If the pulse width modulation is implemented according to self-oscillating modulator principles as described above, a further feedback should be provided, as illustrated by the dashed line.

Figure 25:
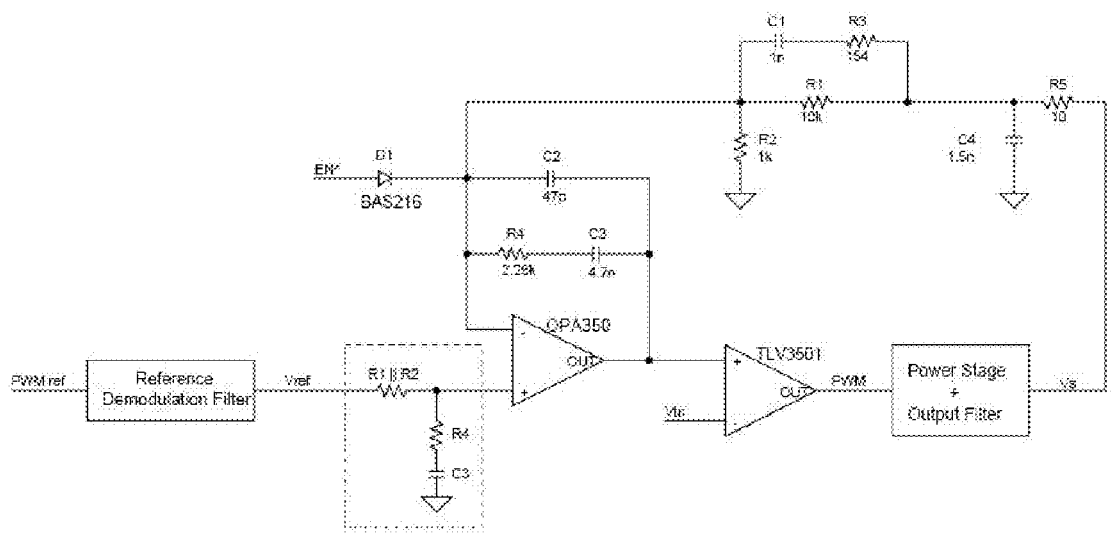

FIG. 25 illustrates an implementation of a tracking power supply according to the embodiment of FIG. 24.

The invention claimed is:

1. A switching amplifier comprising
  at least one pulse modulator arranged for modulating at least one utility signal into at least one pulse modulated signal,
  at least one switching power stage arranged to establish at least one amplified utility signal on the basis of said at least one pulse modulated signal and a power signal, said power signal being delivered by a controlled power supply, and
  a correction signal estimator arranged to establish a correction signal,
  wherein said controlled power supply, correction signal estimator and at least one pulse modulator are arranged according to one of
    said controlled power supply being controlled at least partly on the basis of said at least one utility signal, said correction signal being established on the basis of a supply information signal derived from said controlled power supply, and said pulse modulator processing said utility signal according to said correction signal, and
    said at least one utility signal being established at least partly on the basis of at least one input utility signal according to a gain factor, said correction signal being established on the basis of said gain factor, and said controlled power supply being controlled at least partly on the basis of said correction signal.

2. A switching amplifier according to claim 1, wherein said correction signal comprises a correction factor.

3. A switching amplifier according to claim 1, wherein said switching amplifier is an open-loop amplifier.

4. A switching amplifier according to claim 1, wherein said switching amplifier comprises at least one feedback loop at least comprising said at least one switching power stage.

5. A switching amplifier according to claim 1, wherein said switching amplifier is a multichannel amplifier comprising at least two pulse modulators and at least two switching power stages.

6. A switching amplifier according to claim 1, wherein said switching amplifier comprises at least one output filter, preferably arranged to demodulate said amplified utility signal into a signal suitable for reproduction by at least one loudspeaker.

7. A switching amplifier according to claim 1, wherein said correction signal estimator comprises a ratio circuit.

8. A switching amplifier according to claim 1, wherein said correction signal estimator comprises at least one prediction circuit.

9. A switching amplifier according to claim 1, wherein a switch frequency of pulse modulation in said controlled power supply is selected to be different from a switch frequency of pulse modulation in said at least one pulse modulator.

10. A switching amplifier according to claim 1 comprising at least one pulse modulator arranged for modulating at least one input utility signal into at least one pulse modulated signal and at least one switching power stage arranged to establish at least one amplified utility signal on the basis of said at least one pulse modulated signal and a power signal, said power signal being delivered by a tracking power supply at least partly controlled by said at least one input utility signal,
characterized in that said switching amplifier is arranged to process said at least one input utility signal according to a correction signal established by a correction signal estimator on the basis of a supply information signal derived from said tracking power supply.

11. A switching amplifier according to claim 4, wherein said correction signal is applied to said at least one input utility signal inside said at least one feedback loop.

12. A switching amplifier according to claim 1, wherein said controlled power supply comprises a tracking power supply comprising a level computer determining a desired power signal, a supply pulse modulator generating a modulated desired power signal a supply switching power stage and a supply output filter establishing said power signal.

13. A switching amplifier according to claim 12, wherein said level computer determines said desired power signal at least partly on the basis of said at least one input utility signal according to a predetermined tracking algorithm.

14. A switching amplifier according to claim 13, wherein said predetermined tracking algorithm applies a lower threshold, e.g. corresponding to 10% of the dynamic range.

15. A switching amplifier according to claim 13, wherein said predetermined tracking algorithm applies a bandwidth limiter, e.g. corresponding to 1 kHz or 10% of the bandwidth of said tracking power supply.

16. A switching amplifier according to claim 13, wherein said predetermined tracking algorithm comprises an attack/decay filter.

17. A switching amplifier according to claim 1, wherein said supply information signal comprises at least one of said desired power signal, said modulated desired power signal, said power signal and a power signal reference.

18. A switching amplifier according to claim 7, wherein said ratio circuit is arranged to determine a ratio of a power signal reference by a desired power signal.

19. A switching amplifier according to claim 7, wherein said ratio circuit is arranged to determine a ratio of a power signal reference by said power signal.

20. A switching amplifier according to claim 7, wherein said ratio circuit is arranged to determine a ratio of a modulated desired power signal by said power signal.

21. A switching amplifier according to claim 7, wherein said ratio circuit comprises a pulse modulated ratio circuit and a decimation circuit.

22. A switching amplifier according to claim 1, wherein said processing of said input utility signal according to said correction signal comprises multiplying said input utility signal with said correction signal.

23. A switching amplifier according to claim 1 processing at least one optimized utility signal according to a power signal, comprising at least one dynamics optimizer arranged to establish said at least one optimized utility signal on the basis of least one input utility signal and a variable power supply establishing said power signal at least partly controlled by a correction signal established on the basis of a gain factor derived from said dynamics optimizer.

24. A switching amplifier according to claim 1 comprising at least one dynamics optimizer arranged for changing the dynamics of at least one input utility signal in order to establish at least one optimized utility signal, at least one pulse modulator arranged for modulating said at least one optimized utility signal into at least one pulse modulated signal and at least one switching power stage arranged to establish at least one amplified utility signal on the basis of said at least one pulse modulated signal and a power signal, said power signal being delivered by a variable power supply at least partly controlled by a correction signal established by a correction signal estimator on the basis of a gain factor derived from said dynamics optimizer.

25. A switching amplifier according to claim 1, wherein said switching amplifier comprises at least one feedback loop at least comprising said at least one switching power stage, and wherein said dynamics optimizer is located inside said at least one feedback loop.

26. A switching amplifier according to claim 1, wherein said controlled power supply comprises a variable power supply.

27. A multichannel amplifier comprising
at least two pulse modulators arranged for modulating at least two utility signals into at least two pulse modulated signals,
at least two switching power stages arranged to establish at least two amplified utility signals on the basis of said at least two pulse modulated signals and a shared power signal, said shared power signal being delivered by a controlled power supply, and
a correction signal estimator arranged to establish a correction signal,
wherein said controlled power supply, correction signal estimator and at least two pulse modulators are arranged according to one of
said controlled power supply being controlled at least partly on the basis of said at least two utility signals, said correction signal being established on the basis of a supply information signal derived from said controlled power supply, and said pulse modulators processing said utility signals according to said correction signal, or
said at least two output utility signals being established at least partly on the basis of at least two input utility signals according to a gain factor, said correction signal being established on the basis of said gain factor, and said controlled power supply being controlled at least partly on the basis of said correction signal.

28. A switching amplifier according to claim 1, wherein said at least one switching power stage comprises a power amplifier with feedback, and said switching amplifier further comprises a voltage divider operating on said power signal, and at least one buffer arranged to scale said pulse modulated signal in accordance with an output of said voltage divider.

29. A multichannel amplifier according to claim 27, wherein said at least two switching power stages comprise power amplifiers with feedback, and said multichannel amplifier further comprises a voltage divider operating on said power signal, and at least two buffers arranged to scale said pulse modulated signals in accordance with an output of said voltage divider.

30. A switching amplifier according to claim 1, wherein said controlled power supply comprises a feedback loop.

\* \* \* \* \*